United States Patent
Wei et al.

(10) Patent No.: US 12,272,554 B2
(45) Date of Patent: *Apr. 8, 2025

(54) METHOD OF MANUFACTURING A SEMICONDUCTOR DEVICE

(71) Applicant: TAIWAN SEMICONDUCTOR MANUFACTURING CO., LTD., Hsinchu (TW)

(72) Inventors: Jia-Lin Wei, Hsinchu (TW); Ming-Hui Weng, Hsinchu (TW); Chih-Cheng Liu, Hsinchu (TW); Yi-Chen Kuo, Hsinchu (TW); Yen-Yu Chen, Hsinchu (TW); Yahru Cheng, Hsinchu (TW); Jr-Hung Li, Hsinchu (TW); Ching-Yu Chang, Hsinchu (TW); Tze-Liang Lee, Hsinchu (TW); Chi-Ming Yang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/227,231

(22) Filed: Jul. 27, 2023

(65) Prior Publication Data

US 2023/0369048 A1 Nov. 16, 2023

Related U.S. Application Data

(63) Continuation of application No. 17/150,356, filed on Jan. 15, 2021, now Pat. No. 11,784,046.

(Continued)

(51) Int. Cl.
*H01L 21/033* (2006.01)
*G03F 1/22* (2012.01)
(Continued)

(52) U.S. Cl.
CPC ............ *H01L 21/0332* (2013.01); *G03F 1/22* (2013.01); *G03F 7/70033* (2013.01); *H01L 21/0334* (2013.01); *H01L 21/3081* (2013.01)

(58) Field of Classification Search
None
See application file for complete search history.

(56) References Cited

U.S. PATENT DOCUMENTS

| | | | |
|---|---|---|---|
| 8,796,666 B1 | 8/2014 | Huang et al. | |
| 9,093,530 B2 | 7/2015 | Huang et al. | |

(Continued)

FOREIGN PATENT DOCUMENTS

| | | |
|---|---|---|
| JP | H05-107770 A | 4/1993 |
| KR | 1020190132940 A | 11/2019 |
| WO | 2019/217749 A1 | 11/2019 |

OTHER PUBLICATIONS

Notice of Allowance issued in U.S. Appl. No. 17/150,356, dated May 17, 2023.

(Continued)

*Primary Examiner* — Stephanie P Duclair
(74) *Attorney, Agent, or Firm* — STUDEBAKER BRACKETT PLLC

(57) ABSTRACT

A method of manufacturing semiconductor device includes forming a multilayer photoresist structure including a metal-containing photoresist over a substrate. The multilayer photoresist structure includes two or more metal-containing photoresist layers having different physical parameters. The metal-containing photoresist is a reaction product of a first precursor and a second precursor, and each layer of the multilayer photoresist structure is formed using different photoresist layer formation parameters. The different photoresist layer formation parameters are one or more selected from the group consisting of the first precursor, an amount of the first precursor, the second precursor, an amount of the (Continued)

second precursor, a length of time each photoresist layer formation operation, and heating conditions of the photoresist layers. The multilayer photoresist structure is selectively exposed to actinc radiation to form a latent pattern, and the latent pattern is developed by applying developer to the selectively exposed multilayer photoresist structure to form the pattern.

20 Claims, 25 Drawing Sheets

Related U.S. Application Data

(60) Provisional application No. 63/026,688, filed on May 18, 2020, provisional application No. 63/002,351, filed on Mar. 30, 2020.

(51) Int. Cl.
*G03F 7/00* (2006.01)
*H01L 21/308* (2006.01)

(56) References Cited

U.S. PATENT DOCUMENTS

| | | |
|---|---|---|
| 9,213,234 B2 | 12/2015 | Chang |
| 9,223,220 B2 | 12/2015 | Chang |
| 9,256,133 B2 | 2/2016 | Chang |
| 9,310,684 B2 | 4/2016 | Meyers et al. |
| 9,536,759 B2 | 1/2017 | Yang et al. |
| 9,548,303 B2 | 1/2017 | Lee et al. |
| 9,857,684 B2 | 1/2018 | Lin et al. |
| 9,859,206 B2 | 1/2018 | Yu et al. |
| 9,875,892 B2 | 1/2018 | Chang et al. |
| 11,366,386 B2 | 6/2022 | Watanabe et al. |
| 2012/0088193 A1 | 4/2012 | Weidman et al. |
| 2012/0088369 A1* | 4/2012 | Weidman ............... G03F 7/094 430/296 |

OTHER PUBLICATIONS

Non-Final Office Action issued in U.S. Appl. No. 17/150,356, dated Dec. 21, 2022.

* cited by examiner

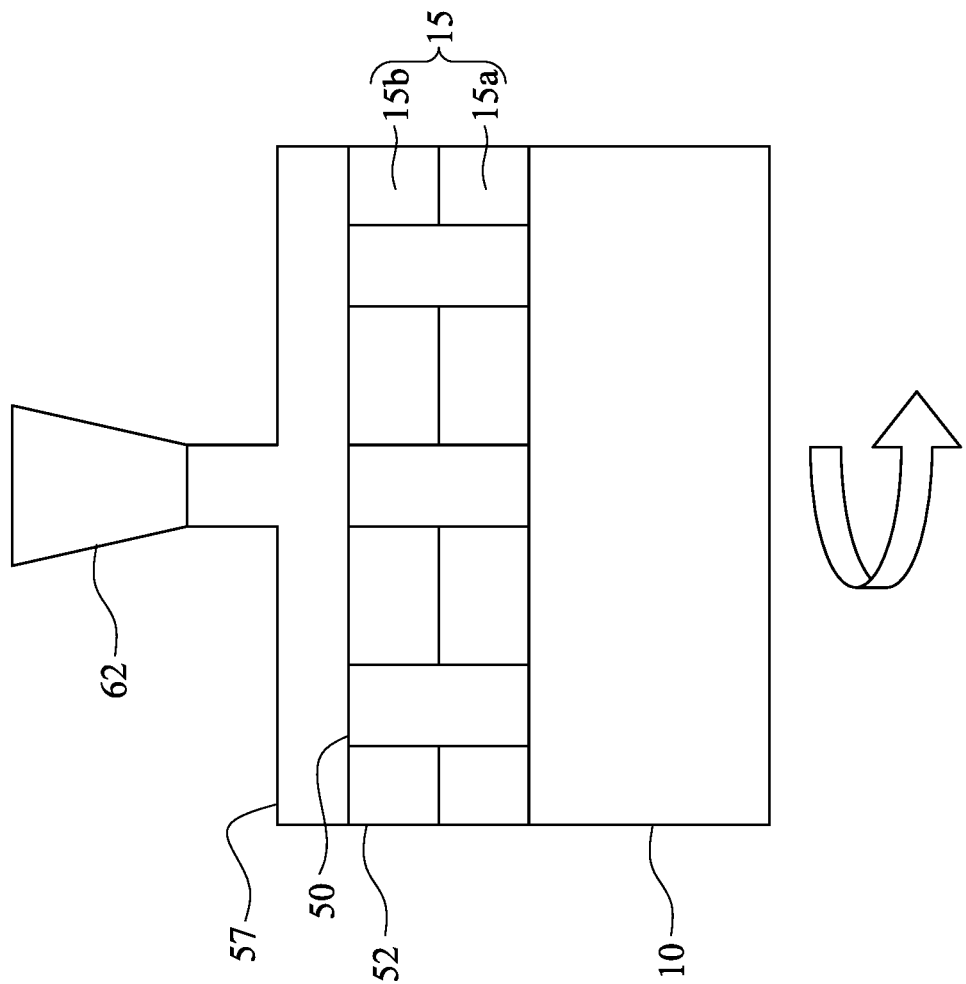

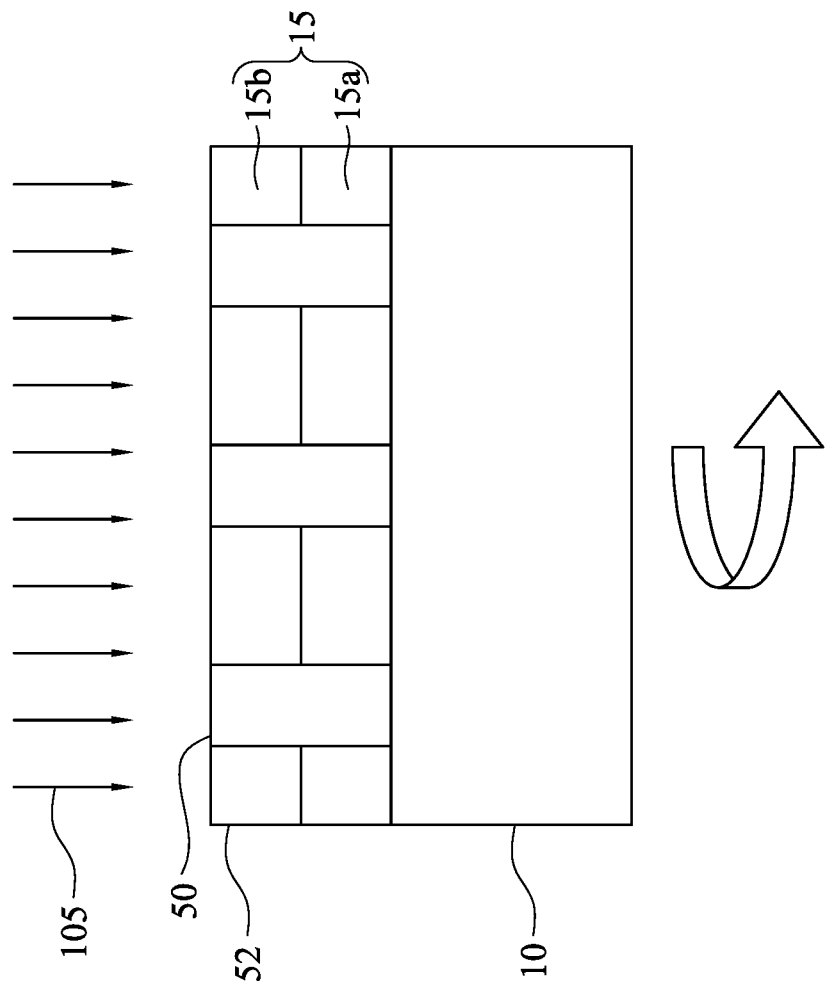

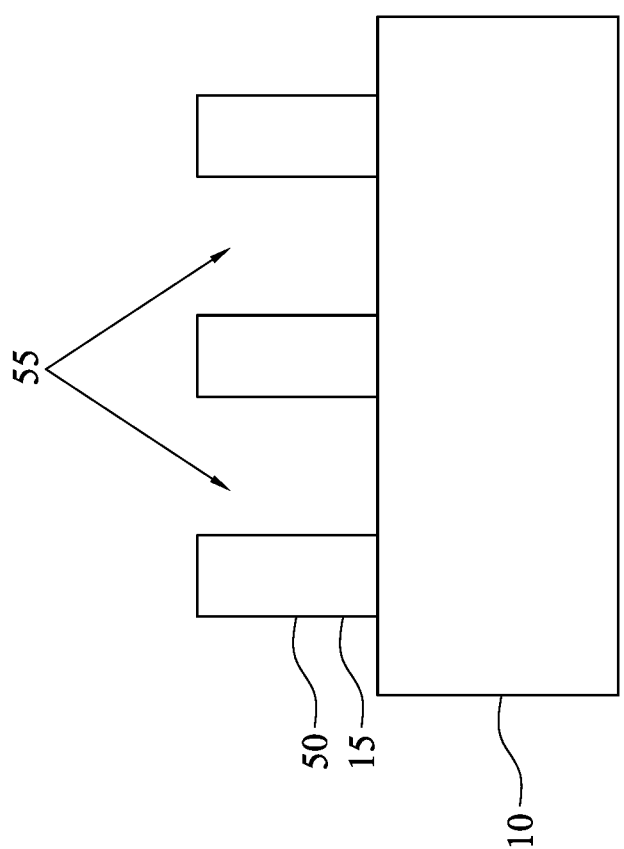

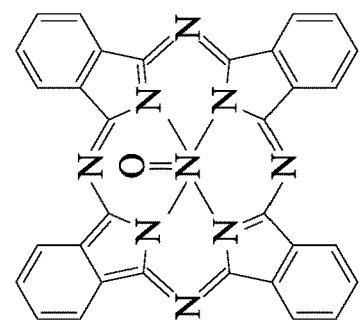
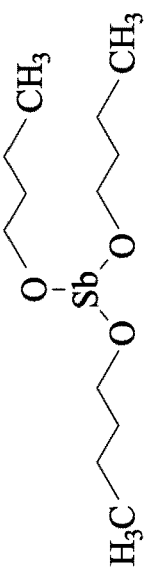
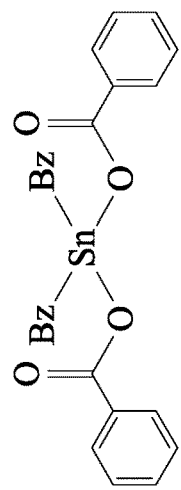
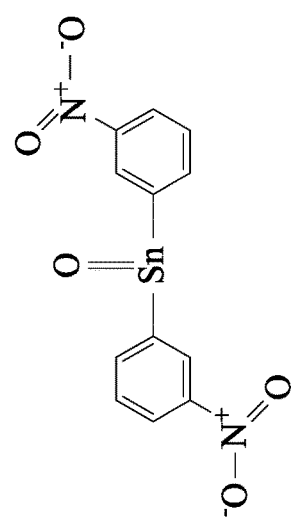
examples:
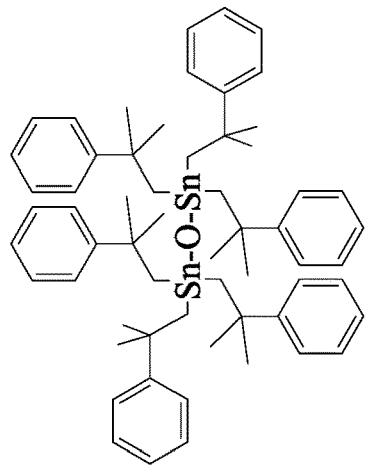
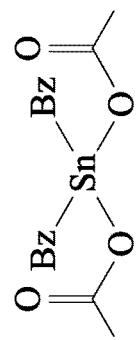
Fig. 7C

|  | Cross-linking density | Thickness | Organometallic Precursor Concentration | H2O% |
|---|---|---|---|---|
| Top layer | Low | Same | Low | Same |
| Middle layer | Middle | Same | Middle | Same |
| Bottom layer | High | Same | High | Same |

Fig. 11A

|  | Cross-linking density | Thickness | Organometallic Precursor Concentration | H2O% |
|---|---|---|---|---|
| Top layer | Low | Same | Same | Low |
| Middle layer | Middle | Same | Same | Middle |
| Bottom layer | High | Same | Same | High |

Fig. 11B

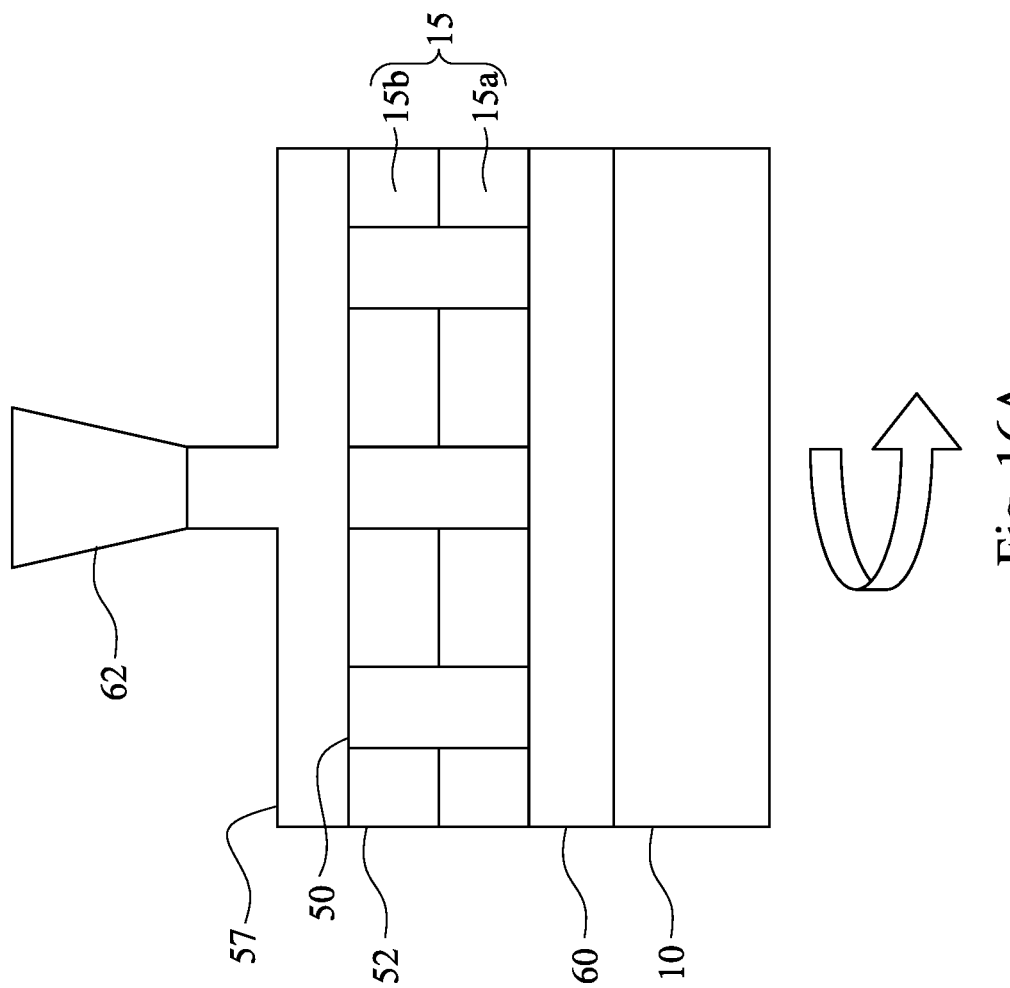

METHOD OF MANUFACTURING A SEMICONDUCTOR DEVICE

RELATED APPLICATIONS

This application is a continuation application of U.S. application Ser. No. 17/150,356, filed Jan. 15, 2021, which claims priority to U.S. Provisional Patent Application No. 63/002,351 filed Mar. 30, 2020, and U.S. Provisional Patent Application No. 63/026,688 filed May 18, 2020, the entire contents of each are incorporated herein by reference.

BACKGROUND

As consumer devices have gotten smaller and smaller in response to consumer demand, the individual components of these devices have necessarily decreased in size as well. Semiconductor devices, which make up a major component of devices such as mobile phones, computer tablets, and the like, have been pressured to become smaller and smaller, with a corresponding pressure on the individual devices (e.g., transistors, resistors, capacitors, etc.) within the semiconductor devices to also be reduced in size.

One enabling technology that is used in the manufacturing processes of semiconductor devices is the use of photolithographic materials. Such materials are applied to a surface of a layer to be patterned and then exposed to an energy that has itself been patterned. Such an exposure modifies the chemical and physical properties of the exposed regions of the photosensitive material. This modification, along with the lack of modification in regions of the photosensitive material that were not exposed, can be exploited to remove one region without removing the other.

However, as the size of individual devices has decreased, process windows for photolithographic processing has become tighter and tighter. As such, advances in the field of photolithographic processing are necessary to maintain the ability to scale down the devices, and further improvements are needed in order to meet the desired design criteria such that the march towards smaller and smaller components may be maintained.

As the semiconductor industry has progressed into nanometer technology process nodes in pursuit of higher device density, higher performance, and lower costs, there have been challenges in reducing semiconductor feature size. Extreme ultraviolet lithography (EUVL) has been developed to form smaller semiconductor device feature size and increase device density on a semiconductor wafer. In order to improve EUVL an increase in wafer exposure throughput is desirable. Wafer exposure throughput can be improved through increased exposure power or increased resist photo speed.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 4A and 4B show a process stage of a sequential operation according to embodiments of the disclosure.

FIG. 5 shows a process stage of a sequential operation according to an embodiment of the disclosure.

FIG. 7C shows examples of embodiments of organometallic precursors according to embodiments of the disclosure.

FIGS. 11A and 11B show tables with parameters of the photoresist layers of a multilayer photoresist structure according to embodiments of the disclosure.

FIGS. 16A and 16B shows a process stage of a sequential operation according to an embodiment of the disclosure.

DETAILED DESCRIPTION

Figure 1:
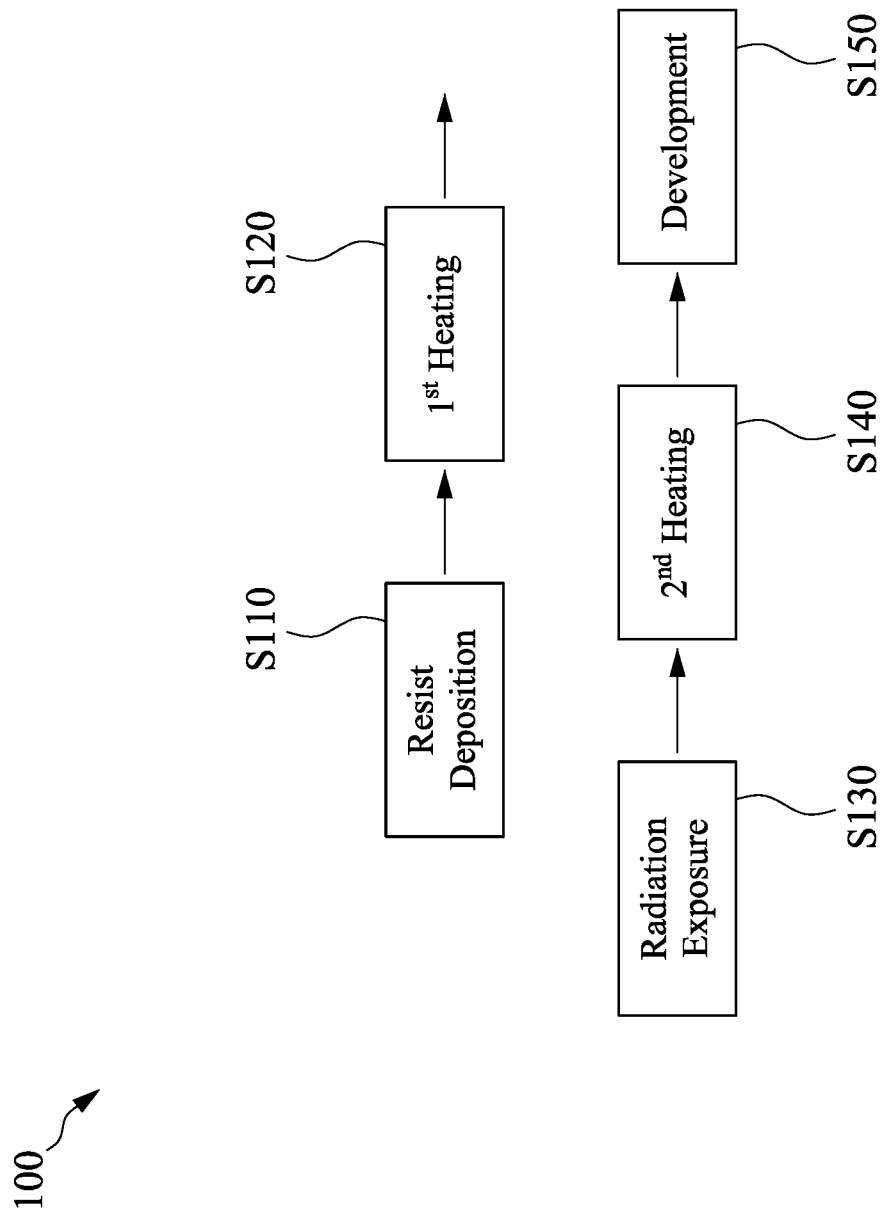
FIG. 1 illustrates a process flow of manufacturing a semiconductor device according to embodiments of the disclosure.

It is to be understood that the following disclosure provides many different embodiments, or examples, for implementing different features of the disclosure. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of."

Metal-containing photoresists are used in extreme ultraviolet lithography because metals have a high absorption capacity of EUV radiation. Metal-containing photoresist layers, however, may outgas during processing which can cause the photoresist layer quality to change over time and may cause contamination, thereby negatively affecting lithography performance, and increasing defects.

Furthermore, uneven exposure of the photoresist, especially at deeper portions of the photoresist layer may result in an uneven degree of cross-linking of the photoresist. Uneven exposure results from a lower amount of light energy reaching the lower portions of the photoresist layer. Low exposure dose may lead to increased line width roughness and reduced critical dimension uniformity. Low exposure dose at the lower portions of the photoresist and uneven exposure may result in poor line width roughness (LWR). Low exposure dose at the lower portions of the photoresist layer may result in a T-top resist profile, instead of a straight edge resist profile. Because of the low exposure dose at the lower portions of the photoresist layer there may be greater crosslinking in the upper portions of the photoresist layer than the lower portions of the photoresist layer. Thus, upon development, a T-top resist profile may be produced. A T-top resist profile is a resist profile that is wider at an upper portion than the portion of the resist below the upper portion as seen in a cross-sectional view. A profile shaped like a capital letter T is an example of a T-top resist profile.

In embodiments of the disclosure, the above issues are addressed by forming a multilayer photoresist structure over a substrate, wherein the multilayer photoresist structure includes two or more photoresist layers having different physical parameters. In some embodiments, the multilayer photoresist structure includes three to five photoresist layers stacked on top of each other, wherein immediately adjacent photoresist layers have different physical parameters.

Figure 2:
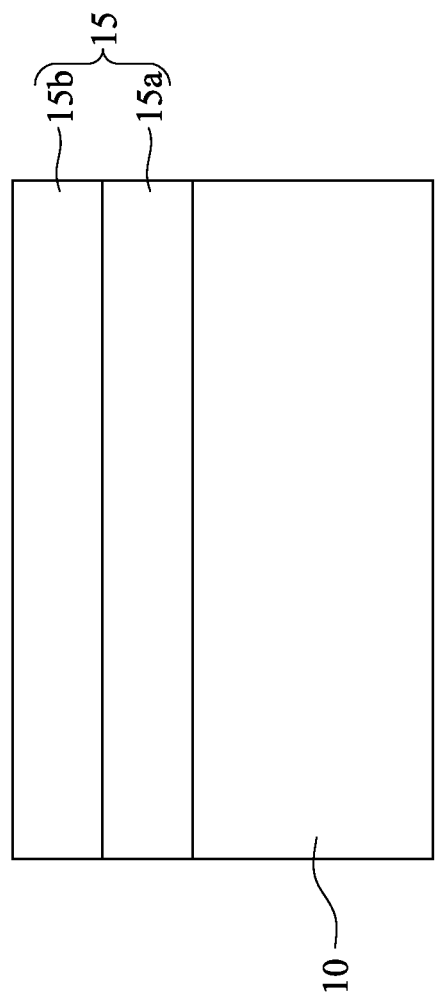
FIG. 2 shows a process stage of a sequential operation according to an embodiment of the disclosure.

FIG. 1 illustrates a process flow 100 of manufacturing a semiconductor device according to embodiments of the disclosure. Photoresist is coated on a surface of a layer to be patterned or a substrate 10 in operation S110, in some embodiments, to form a multilayer photoresist structure 15, as shown in FIG. 2. In some embodiments, the multilayer photoresist structure 15 includes two photoresist layers 15a, 15b, while in other embodiments, the multilayer photoresist structure 15 includes, three, four, five, or more photoresist layers. Then the multilayer photoresist structure 15 undergoes a first heating operation (or pre-exposure bake) S120 of the photoresist composition in some embodiments. The multilayer photoresist structure 15 is heated at a temperature and time sufficient to cure the multilayer photoresist structure 15. In some embodiments, the multilayer photoresist structure 15 is heated to a temperature of about 50° C. to about 200° C. for about 10 seconds to about 10 minutes. In other embodiments, the multilayer photoresist structure is heated to a temperature of about 100° C. to about 150° C. for about 1 minute to about 5 minutes. In some embodiments, a heating operation S120 is performed after each photoresist layer is formed. In some embodiments, the first heating operation S120 is not performed. If the heating operation is at a temperature or for a time less than the disclosed ranges there may be insufficient crosslinking and the photoresist structure LWR may decrease. If the heating operation is at a temperature or for a time greater than these ranges there may be too much crosslinking and the photoresist structure LWR may decrease.

The multilayer photoresist structure 15 is selectively exposed to actinic radiation 45/97 (see FIGS. 3A and 3B) in operation S130. In some embodiments, the multilayer photoresist structure 15 is selectively exposed to ultraviolet radiation. In some embodiments, the ultraviolet radiation is deep ultraviolet (DUV) radiation. In some embodiments, the ultraviolet radiation is extreme ultraviolet (EUV) radiation. In some embodiments, the radiation is an electron beam.

Figure 3A:
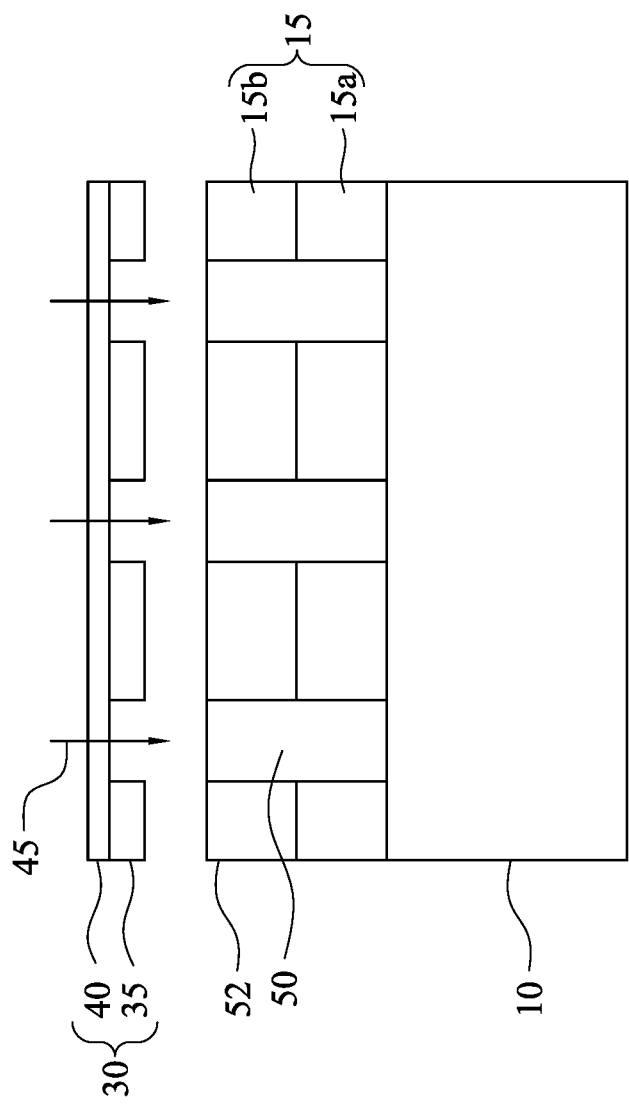
FIGS. 3A and 3B show a process stage of a sequential operation according to embodiments of the disclosure.

As shown in FIG. 3A, the exposure radiation 45 passes through a photomask 30 before irradiating the multilayer photoresist structure 15 in some embodiments. In some embodiments, the photomask has a pattern to be replicated in the multilayer photoresist structure 15. The pattern is formed by an opaque pattern 35 on the photomask substrate 40, in some embodiments. The opaque pattern 35 may be formed by a material opaque to ultraviolet radiation, such as chromium, while the photomask substrate 40 is formed of a material that is transparent to ultraviolet radiation, such as fused quartz.

Figure 3B:
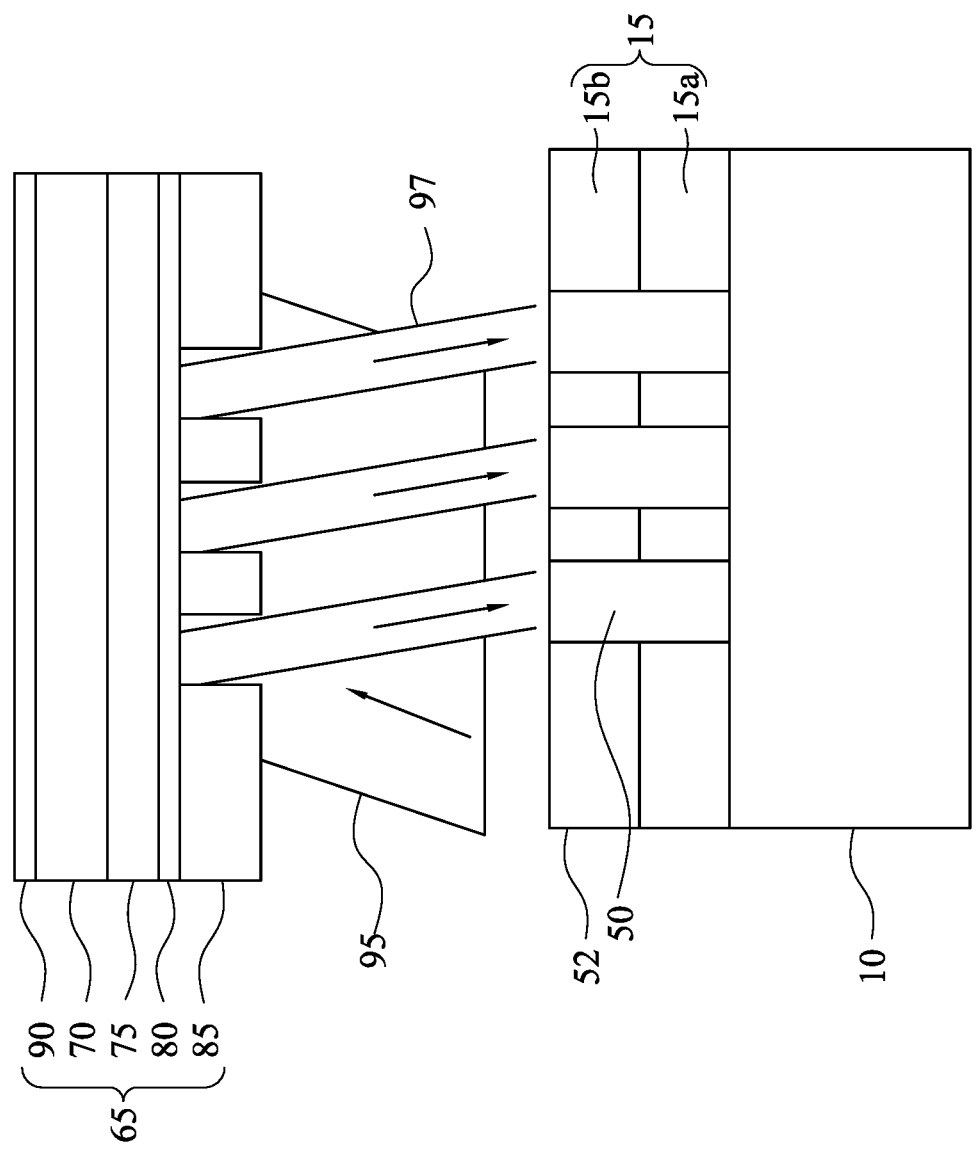

In some embodiments, the selective exposure of the multilayer photoresist structure 15 to form exposed regions 50 and unexposed regions 52 is performed using extreme ultraviolet lithography. In an extreme ultraviolet lithography operation a reflective photomask 65 is used to form the patterned exposure light, as shown in FIG. 3B. The reflective photomask 65 includes a low thermal expansion glass substrate 70, on which a reflective multilayer 75 of Si and Mo is formed. A capping layer 80 and absorber layer 85 are formed on the reflective multilayer 75. A rear conductive layer 90 is formed on the back side of the low thermal expansion substrate 70. In extreme ultraviolet lithography, extreme ultraviolet radiation 95 is directed towards the reflective photomask 65 at an incident angle of about 6°. A portion 97 of the extreme ultraviolet radiation is reflected by the Si/Mo multilayer 75 towards the photoresist-coated substrate 10, while the portion of the extreme ultraviolet radiation incident upon the absorber layer 85 is absorbed by the photomask. In some embodiments, additional optics, including mirrors, are between the reflective photomask 65 and the photoresist-coated substrate.

In some embodiments, the exposure to radiation is carried out by placing the photoresist-coated substrate in a photolithography tool. The photolithography tool includes a photomask 30/65, optics, an exposure radiation source to provide the radiation 45/97 for exposure, and a movable stage for supporting and moving the substrate under the exposure radiation.

In some embodiments, optics (not shown) are used in the photolithography tool to expand, reflect, or otherwise control the radiation before or after the radiation; 45/97 is patterned by the photomask 30/65. In some embodiments, the optics include one or more lenses, mirrors, filters, and combinations thereof to control the radiation 45/97 along its path.

In some embodiments, the radiation is electromagnetic radiation, such as g-line (wavelength of about 436 nm), i-line (wavelength of about 365 nm), ultraviolet radiation, far ultraviolet radiation, extreme ultraviolet, electron beams, or the like. In some embodiments, the radiation source is selected from the group consisting of a mercury vapor lamp, a xenon lamp, a carbon arc lamp, a KrF excimer laser light (wavelength of 248 nm), an ArF excimer laser light (wavelength of 193 nm), an $F_2$ excimer laser light (wavelength of 157 nm), and a $CO_2$ laser-excited Sn plasma (extreme ultraviolet, wavelength of 13.5 nm).

The amount of electromagnetic radiation can be characterized by a fluence or dose, which is obtained by the integrated radiative flux over the exposure time. Suitable radiation fluences range from about 1 $mJ/cm^2$ to about 150 $mJ/cm^2$ in some embodiments, from about 2 $mJ/cm^2$ to about 100 $mJ/cm^2$ in other embodiments, and from about 3 $mJ/cm^2$ to about 50 $mJ/cm^2$ in other embodiments. A person of ordinary skill in the art will recognize that additional ranges of radiation fluences within the explicit ranges above are contemplated and are within the present disclosure.

In some embodiments, the selective or patternwise exposure is performed by a scanning electron beam. With electron beam lithography, the electron beam induces secondary electrons, which modify the irradiated material. High resolution is achievable using electron beam lithography and the metal-containing resists disclosed herein. Electron beams can be characterized by the energy of the beam, and suitable energies range from about 5 V to about 200 kV (kilovolt) in some embodiments, and from about 7.5 V to about 100 kV in other embodiments. Proximity-corrected beam doses at 30 kV range from about 0.1 $\mu C/cm^2$ to about 5 $\mu C/cm^2$ in some embodiments, from about 0.5 $\mu C/cm^2$ to about 1 $\mu C/cm^2$ in other embodiments, and in other embodiments from about 1 $\mu C/cm^2$ to about 100 $\mu C/cm^2$. A person of ordinary skill in the art can compute corresponding doses at other beam energies based on the teachings herein and will recognize that additional ranges of electron beam properties within the explicit ranges above are contemplated and are within the present disclosure.

The region of the photoresist structure exposed to radiation 50 undergoes a chemical reaction thereby changing its solubility in a subsequently applied developer relative to the region of the photoresist layer not exposed to radiation 52. In some embodiments, the portion of the photoresist structure exposed to radiation 50 undergoes a reaction making the exposed portion more soluble in a developer. In other embodiments, the portion of the photoresist structure exposed to radiation 50 undergoes a crosslinking reaction making the exposed portion less soluble in a developer.

Next, the multilayer photoresist structure 15 undergoes a second heating (or post-exposure bake) in operation S140 in some embodiments. In some embodiments, the multilayer photoresist structure 15 is heated to a temperature of about 50° C. to about 250° C. for about 20 seconds to about 10 minutes depending on the thickness of the photoresist layers and the desired degree of crosslinking. In some embodiments, the multilayer photoresist structure 15 is heated to a temperature of about 100° C. to about 200° C. for about 1 minute to about 5 minutes. The post-exposure baking further crosslinks the exposed portion 50 of the photoresist structure in some embodiments, thereby increasing the differences in the solubility between the exposed region 50 and the unexposed region 52. If the heating operation is at a temperature or for a time less than the disclosed ranges there may be insufficient crosslinking and the photoresist structure LWR may decrease. If the heating operation is at a temperature or for a time greater than these ranges there may be too much crosslinking and the photoresist structure LWR may decrease. If there is too little crosslinking, portions of the exposed regions, which are not supposed to be removed during the development operation, may be removed during the development operation and the resulting pattern does not have the desired definition. If there is too much crosslinking in portions of the unexposed regions, which are supposed to be removed during the development operation, may not be removed and the resulting pattern does not have the desired definition.

The selectively exposed photoresist structure is subsequently developed in operation S150. In some embodiments, the multilayer photoresist structure 15 is developed by applying a solvent-based developer 57 to the selectively exposed multilayer photoresist structure 15. As shown in FIG. 4A, a liquid developer 57 is supplied from a dispenser 62 to the multilayer photoresist structure 15. In some embodiments, the exposed portions 50 of the photoresist structure undergo a crosslinking reaction as a result of the exposure to actinic radiation or the post-exposure bake, and the unexposed portion of the photoresist structure 52 is removed by the developer 57 forming a pattern of openings 55 in the photoresist structure 15 to expose the substrate 10, as shown in FIG. 5.

In some embodiments, the photoresist developer 57 includes a solvent, and an acid or a base. In some embodiments, the concentration of the solvent is from about 60 wt. % to about 99 wt. % based on the total weight of the photoresist developer. The acid or base concentration is from about 0.001 wt. % to about 20 wt. % based on the total weight of the photoresist developer. In certain embodiments, the acid or base concentration in the developer is from about 0.01 wt. % to about 15 wt. % based on the total weight of the photoresist developer.

In some embodiments, the developer 57 is applied to the multilayer photoresist structure 15 using a spin-on process. In the spin-on process, the developer 57 is applied to the multilayer photoresist structure 15 from above the multilayer photoresist structure 15 while the photoresist-coated substrate is rotated, as shown in FIG. 4A. In some embodiments, the developer 57 is supplied at a rate of between about 5 ml/min and about 800 ml/min, while the photoresist coated substrate 10 is rotated at a speed of between about 100 rpm and about 2000 rpm. In some embodiments, the developer is at a temperature of between about 10° C. and about 80° C. The development operation continues for between about 30 seconds to about 10 minutes in some embodiments.

In some embodiments, the developer 57 is an organic solvent. The organic solvent can be any suitable solvent. In some embodiments, the solvent is one or more selected from propylene glycol methyl ether acetate (PGMEA), propylene glycol monomethyl ether (PGME), 1-ethoxy-2-propanol (PGEE), γ-butyrolactone (GBL), cyclohexanone (CHN), ethyl lactate (EL), methanol, ethanol, propanol, n-butanol, 4-methyl-2-pentanol, acetone, methyl ethyl ketone, dimethylformamide (DMF), isopropanol (IPA), tetrahydrofuran (THF), methyl isobutyl carbinol (MIBC), n-butyl acetate (nBA), 2-heptanone (MAK), and dioxane.

While the spin-on operation is one suitable method for developing the multilayer photoresist structure 15 after exposure, it is intended to be illustrative and is not intended to limit the embodiment. Rather, any suitable development operations, including dip processes, puddle processes, and spray-on methods, may alternatively be used. All such development operations are included within the scope of the embodiments.

In some embodiments, a dry developer 105 is applied to the selectively exposed multilayer photoresist structure 15, as shown in FIG. 4B. In some embodiments, the dry developer 105 is a plasma or chemical vapor, and the dry development operation S150 is a plasma etching or chemical etching operation. The dry development uses the differences related to the composition, extent of cross-linking, and film density to selectively remove the desired portions of the resist. In some embodiments, the dry development processes uses either a gentle plasma (high pressure, low power) or a thermal process in a heated vacuum chamber while flowing a dry development chemistry, such as $BCl_3$, $BF_3$, or other Lewis Acid in the vapor state. In some embodiments, the $BCl_3$ removes the unexposed material, leaving behind a pattern of the exposed film that is transferred into the underlying layers by plasma-based etch processes.

In some embodiments, the dry development includes plasma processes, including transformer coupled plasma (TCP), inductively coupled plasma (ICP) or capacitively coupled plasma (CCP). In some embodiments, the plasma process is conducted at a pressure of ranging from about 5 mTorr to a pressure of about 20 mTorr, at a power level from about 250 W to about 1000 W, temperature ranging from about 0° C. to about 300° C., and at flow rate of about 100 to about 1000 sccm, for about 1 to about 3000 seconds.

Figure 6:
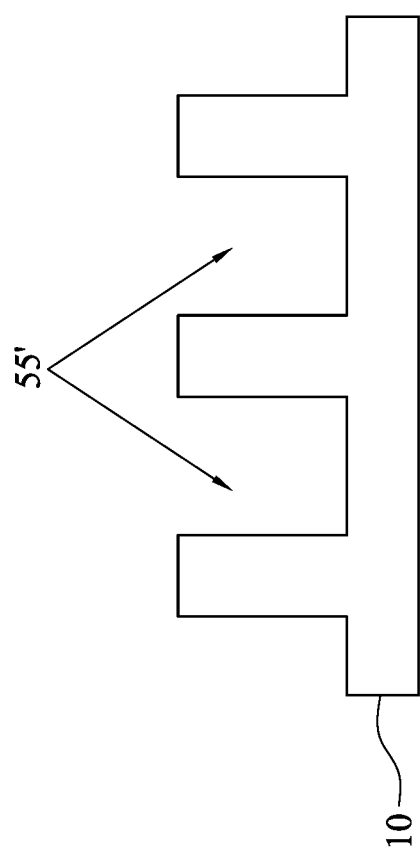
FIG. 6 shows a process stage of a sequential operation according to an embodiment of the disclosure.

In some embodiments, the pattern of openings 55 in the multilayer photoresist structure 15 is extended into the layer to be patterned or substrate 10 to create a pattern of openings 55' in the substrate 10, thereby transferring the pattern in the photoresist layer 15 into the substrate 10, as shown in FIG. 6. The pattern is extended into the substrate by etching, using one or more suitable etchants. The exposed multilayer photoresist structure 15 is at least partially removed during the etching operation in some embodiments. In other embodiments, the exposed photoresist layer 15 is removed after etching the substrate 10 by using a suitable photoresist stripper solvent or by a photoresist ashing operation.

In some embodiments, the substrate 10 includes a single crystalline semiconductor layer on at least its surface portion. The substrate 10 may include a single crystalline semiconductor material such as, but not limited to Si, Ge, SiGe, GaAs, InSb, GaP, GaSb, InAlAs, InGaAs, GaSbP, GaAsSb and InP. In some embodiments, the substrate 10 is a silicon layer of an SOI (silicon-on insulator) substrate. In certain embodiments, the substrate 10 is made of crystalline Si.

The substrate 10 may include in its surface region, one or more buffer layers (not shown). The buffer layers can serve to gradually change the lattice constant from that of the substrate to that of subsequently formed source/drain regions. The buffer layers may be formed from epitaxially grown single crystalline semiconductor materials such as, but not limited to Si, Ge, GeSn, SiGe, GaAs, InSb, GaP, GaSb, InAlAs, InGaAs, GaSbP, GaAsSb, GaN, GaP, and InP. In an embodiment, the silicon germanium (SiGe) buffer layer is epitaxially grown on the silicon substrate 10. The germanium concentration of the SiGe buffer layers may increase from 30 atomic % for the bottom-most buffer layer to 70 atomic % for the top-most buffer layer.

In some embodiments, the substrate 10 includes one or more layers of at least one metal, metal alloy, and metal—nitride/sulfide/oxide/silicide having the formula MAa, where M is a metal and A is N, S, Se, O, Si, and a is from about 0.4 to about 2.5. In some embodiments, the substrate 10 includes titanium, aluminum, cobalt, ruthenium, titanium nitride, tungsten nitride, tantalum nitride, and combinations thereof.

In some embodiments, the substrate 10 includes a dielectric material having at least a silicon or metal oxide or nitride of the formula MAb, where M is a metal or Si, A is N or O, and b ranges from about 0.4 to about 2.5. In some embodiments, the substrate 10 includes silicon dioxide, silicon nitride, aluminum oxide, hafnium oxide, lanthanum oxide, and combinations thereof.

The photoresist layers are photosensitive layers that are patterned by exposure to actinic radiation. Typically, the chemical properties of the photoresist regions struck by incident radiation change in a manner that depends on the type of photoresist used. Photoresist layers are either positive tone resists or negative tone resists. A positive tone resist refers to a photoresist material that when exposed to radiation, such as UV light, becomes soluble in a developer, while the region of the photoresist that is non-exposed (or exposed less) is insoluble in the developer. A negative tone resist, on the other hand, refers to a photoresist material that when exposed to radiation becomes insoluble in the developer, while the region of the photoresist that is non-exposed (or exposed less) is soluble in the developer. The region of a negative resist that becomes insoluble upon exposure to radiation may become insoluble due to a cross-linking reaction caused by the exposure to radiation.

Figure 7A:
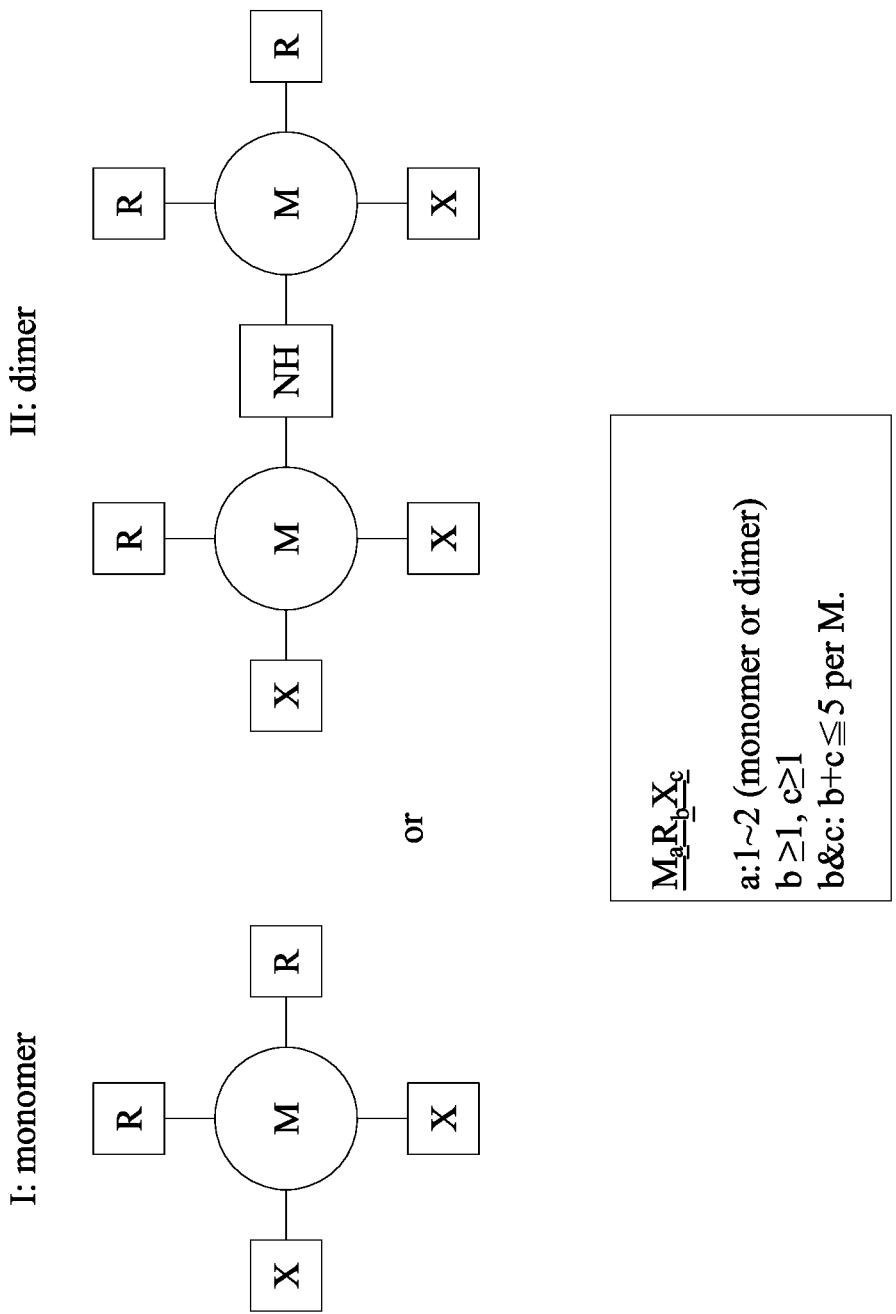
FIG. 7A shows organometallic precursors according to embodiments of the disclosure.

In some embodiments, the photoresist layers are made of a photoresist composition, including a first compound or a first precursor and a second compound or a second precursor combined in a vapor state. In some embodiments, the first precursor or first compound is an organometallic having a formula: $M_aR_bX_c$, as shown in FIG. 7A, where M is one or more metals selected from the group consisting of Sn, Bi, Sb, In, and Te; R is a substituted or unsubstituted alkyl, alkenyl, or carboxylate group. In some embodiments, R is a C3-C6 alkyl, alkenyl, or carboxylate. In some embodiments, R is one or more selected from the group consisting of propyl, isopropyl, butyl, iso-butyl, sec-butyl, tert-butyl, pentyl, isopentyl, sec-pentyl, tert-pentyl, hexyl, iso-hexyl, sec-hexyl, and tert-hexyl. X is a ligand, ion, or other moiety, which is reactive with the second compound or second precursor; and $1 \le a \le 2$, $b \ge 1$, $c \ge 1$, and $b+c \le 5$ in some embodiments. In some embodiments, the alkyl, alkenyl, or carboxylate group is substituted with one or more fluoro groups. In some embodiments, the organometallic precursor is a dimer, as shown in FIG. 7A, where each monomer unit is linked by an amine group. Each monomer has a formula: $M_aR_bX_c$, as defined above.

In some embodiments, R is fluorinated, e.g., having the formula $C_nF_xH_{((2n+1)-x)}$, where $3 \le n \le 6$. In some embodiments, R has at least one beta-hydrogen or beta-fluorine. In some embodiments, R is one or more selected from the group consisting of i-propyl, n-propyl, t-butyl, i-butyl, n-butyl, sec-butyl, n-pentyl, i-pentyl, t-pentyl, and sec-pentyl.

In some embodiments, X is any moiety readily displaced by the second compound or second precursor to generate an M-OH moiety, such as a moiety selected from the group consisting of amines, including dialkylamino and monalkylamino; alkoxy; carboxylates, halogens, and sulfonates. In some embodiments, the sulfonate group is substituted with one or more amine groups. In some embodiments, the halide is one or more selected from the group consisting of F, Cl, Br, and I. In some embodiments, the sulfonate group includes a substituted or unsubstituted C1-C3 group.

Figure 7B:
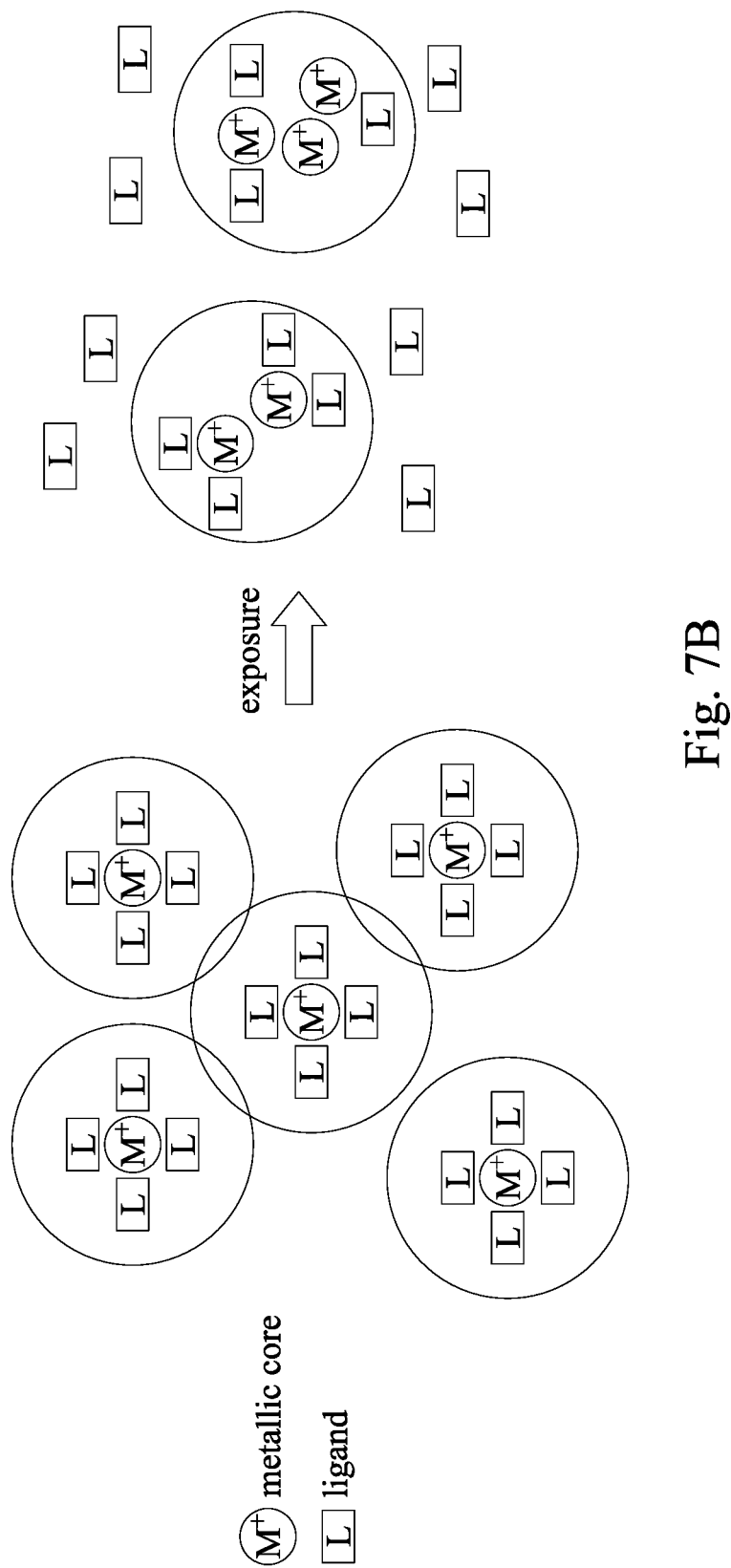
FIG. 7B shows a reaction metallic precursors undergo as a result of exposure to actinic radiation.

In some embodiments, the first organometallic compound or first organometallic precursor includes a metallic core $M^+$ with ligands L attached to the metallic core $M^+$, as shown in FIG. 7B. In some embodiments, the metallic core $M^+$ is a metal oxide. The ligands L include C3-C12 aliphatic or aromatic groups in some embodiments. The aliphatic or aromatic groups may be unbranched or branched with cyclic, or noncyclic saturated pendant groups containing 1-9 carbons, including alkyl groups, alkenyl groups, and phenyl groups. The branched groups may be further substituted with oxygen or halogen. In some embodiments, the C3-C12 aliphatic or aromatic groups include heterocyclic groups. In some embodiments, the C3-C12 aliphatic or aromatic groups are attached to the metal by an ether or ester linkage. In some embodiments, the C3-C12 aliphatic or aromatic groups include nitrite and sulfonate substituents.

FIG. 7B shows a reaction metallic precursors undergo as a result of exposure to actinic radiation in some embodiment As a result of exposure to the actinic radiation, ligand groups L are split off from the metallic core $M^+$ of the metallic precursors, and two or more metallic precursor cores bond with each other.

In some embodiments, the organometallic precursor or organometallic compound include sec-hexyl tris(dimethylamino) tin, t-hexyl tris(dimethylamino) tin, i-hexyl tris(dimethylamino) tin, n-hexyl tris(dimethylamino) tin, sec-pentyl tris(dimethylamino) tin, t-pentyl tris(dimethylamino) tin, i-pentyl tris(dimethylamino) tin, n-pentyl tris(dimethylamino) tin, sec-butyl tris(dimethylamino) tin, t-butyl tris (dimethylamino) tin, i-butyl tris(dimethylamino) tin, n-butyl tris(dimethylamino) tin, sec-butyl tris(dimethylamino) tin, i-propyl(tris)dimethylamino tin, n-propyl tris(diethylamino) tin, and analogous alkyl(tris)(t-butoxy) tin compounds, including sec-hexyl tris(t-butoxy) tin, t-hexyl tris(t-butoxy) tin, i-hexyl tris(t-butoxy) tin, n-hexyl tris(t-butoxy) tin, sec-pentyl tris(t-butoxy) tin, t-pentyl tris(t-butoxy) tin, i-pentyl tris(t-butoxy) tin, n-pentyl tris(t-butoxy) tin, t-butyl tris(t-butoxy) tin, i-butyl tris(butoxy) tin, n-butyl tris(butoxy) tin, sec-butyl tris(butoxy) tin, i-propyl(tris)dimethylamino tin, and n-propyl tris(butoxy) tin. In some embodiments, the organometallic precursors or organometallic compounds are fluorinated. In some embodiments, the organometallic precursors or compounds have a boiling point less than about 200° C.

FIG. 7C shows examples of organometallic precursors according to embodiments of the disclosure. In FIG. 7C, Bz refers to a benzene group.

In some embodiments, the first compound or first precursor includes one or more unsaturated bonds that can be coordinated with a functional group, such as a hydroxyl group, on the surface of the substrate or an intervening underlayer to improve adhesion of the photoresist layer to the substrate or underlayer.

In some embodiments, the second precursor or second compound is one or more selected from the group consisting of water, an amine, a borane, and a phosphine. In some embodiments, the amine has a formula $N_pH_nX_m$, where $0 \leq n \leq 3$, $0 \leq m \leq 3$, $n+m=3$ when p is 1, and $n+m=4$ when p is 2, and each X is independently halogen selected from the group consisting of F, Cl, Br, and I. In some embodiments, the borane has a formula $B_pH_nX_m$, where $0 \leq n \leq 3$, $0 \leq m \leq 3$, $n+m=3$ when p is 1, and $n+m=4$ when p is 2, and each X is independently halogen selected from the group consisting of F, Cl, Br, and I. In some embodiments, the phosphine has a formula $P_pH_nX_m$, where $0 \leq n \leq 3$, $0 \leq m \leq 3$, $n+m=3$, when p is 1, or $n+m=4$ when p is 2, and each X is independently halogen selected from the group consisting of F, Cl, Br, and I.

In some embodiments, the second precursor or compound is water, ammonia, or hydrazine. The reaction product of the water, ammonia, or hydrazine and the organometallic precursor or compound may form hydrogen bonds that increase the boiling point of the reaction product and prevent emission of the metal photoresist material, thereby preventing metal contamination. The hydrogen bonds can also help prevent moisture effects to the photoresist layer quality in some embodiments.

In some embodiments, the operation S110 of depositing a photoresist composition is performed by a vapor phase deposition operation. In some embodiments, the vapor phase deposition operation includes atomic layer deposition (ALD) or chemical vapor deposition (CVD). In some embodiments, the ALD includes plasma-enhanced atomic layer deposition (PE-ALD), and the CVD includes plasma-enhanced chemical vapor deposition (PE-CVD), metal-organic chemical vapor deposition (MO-CVD); atmospheric pressure chemical vapor deposition (AP-CVD), and low pressure chemical vapor deposition (LP-CVD).

Figure 8:
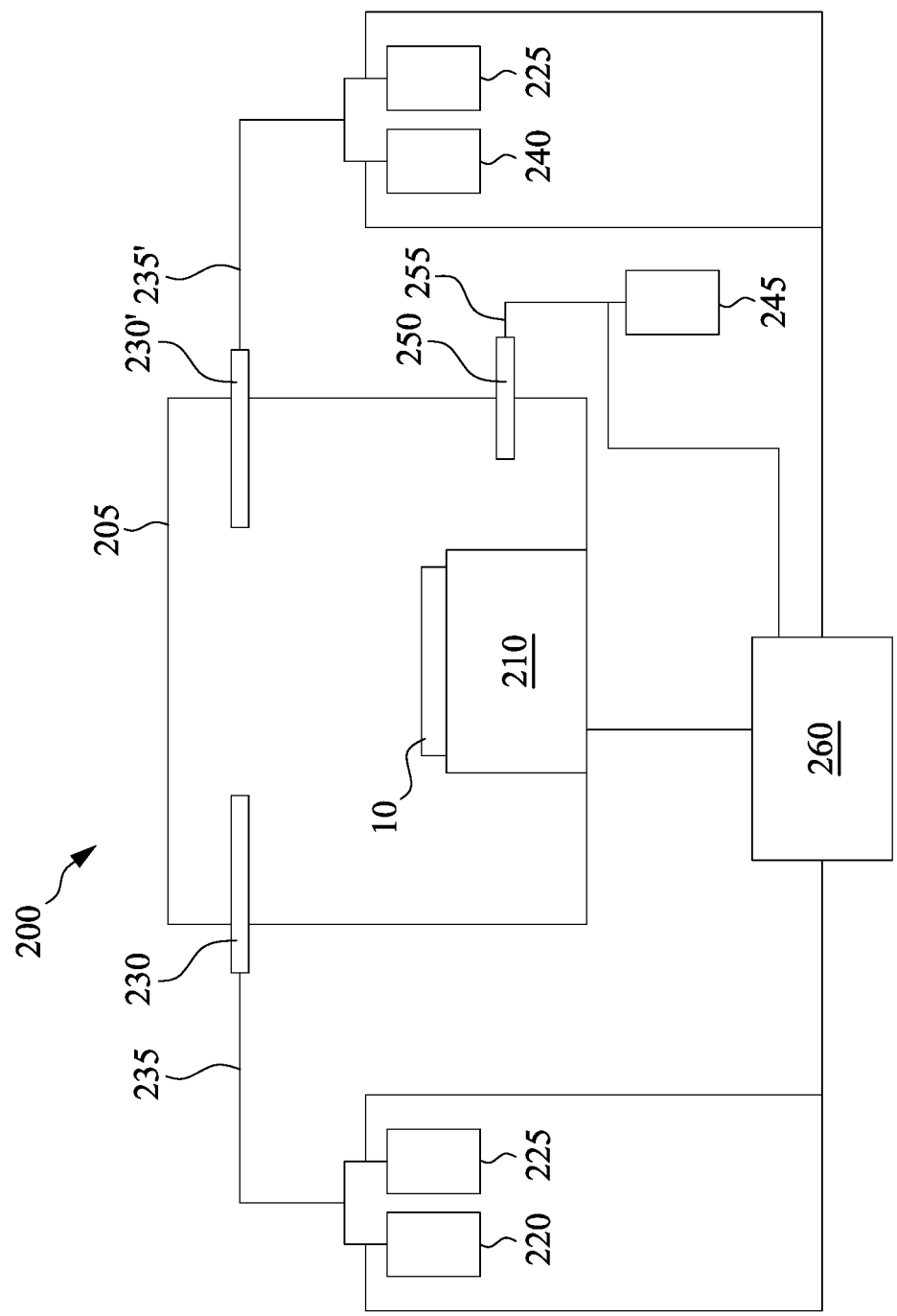
FIG. 8 shows a photoresist deposition apparatus according to some embodiments of the disclosure.

A resist layer deposition apparatus 200 according to some embodiments of the disclosure is shown in FIG. 8. In some embodiments, the deposition apparatus 200 is an ALD or CVD apparatus. The deposition apparatus 200 includes a vacuum chamber 205. A substrate support stage 210 in the vacuum chamber 205 supports a substrate 10, such as silicon wafer. In some embodiments, the substrate support stage 210 includes a heater. A first precursor or compound gas supply 220 and carrier/purge gas supply 225 are connected to an inlet 230 in the chamber via a gas line 235, and a second precursor or compound gas supply 240 and carrier/purge gas supply 225 are connected to another inlet 230' in the chamber via another gas line 235' in some embodiments. The chamber is evacuated, and excess reactants and reaction byproducts are removed by a vacuum pump 245 via an outlet 250 and exhaust line 255. In some embodiments, the flow rate or pulses of precursor gases and carrier/purge gases, evacuation of excess reactants and reaction byproducts, pressure inside the vacuum chamber 205, and temperature of the vacuum chamber 205 or wafer support stage 210 are controlled by a controller 260 configured to control each of these parameters.

Depositing a photoresist layer includes combining the first compound or first precursor and the second compound or second precursor in a vapor state to form the photoresist composition. In some embodiments, the first compound or first precursor and the second compound or second precursor of the photoresist composition are introduced into the deposition chamber 205 (CVD chamber) at about the same time via the inlets 230, 230'. In some embodiments, the first compound or first precursor and second compound or second precursor are introduced into the deposition chamber 205 (ALD chamber) in an alternating manner via the inlets 230, 230', i.e.—initially the first compound or precursor then the second compound or precursor, and then subsequently alternately repeating the introduction of the first compound or precursor followed by the second compound or precursor.

In some embodiments, the deposition chamber temperature ranges from about 30° C. to about 400° C. during the deposition operation, and between about 50° C. to about 250° C. in other embodiments. In some embodiments, the pressure in the deposition chamber ranges from about 5 mTorr to about 100 Torr during the deposition operation, and between about 100 mTorr to about 10 Torr in other embodiments. In some embodiments, the plasma power is less than about 1000 W. In some embodiments, the plasma power ranges from about 100 W to about 900 W. In some embodiments, the flow rate of the first compound or precursor and the second compound or precursor ranges from about 100 sccm to about 1000 sccm. In some embodiments, the ratio of the flow of the organometallic compound precursor to the second compound or precursor ranges from about 1:1 to about 1:5. At operating parameters outside the above-recited ranges, unsatisfactory photoresist layers result in some embodiments. In some embodiments, the photoresist layer formation occurs in a single chamber (a one-pot layer formation).

In a CVD process according to some embodiments of the disclosure, two or more gas streams, in separate inlet paths 230, 235 and 230', 235', of an organometallic precursor and a second precursor are introduced to the deposition chamber 205 of a CVD apparatus, where they mix and react in the gas phase, to form a reaction product. The streams are introduced using separate injection inlets 230, 230' or a dual-plenum showerhead in some embodiments. The deposition apparatus is configured so that the streams of organometallic precursor and second precursor are mixed in the chamber, allowing the organometallic precursor and second precursor to react to form a reaction product. Without limiting the mechanism, function, or utility of the disclosure, it is believed that the product from the vapor-phase reaction becomes heavier in molecular weight, and is then condensed or otherwise deposited onto the substrate 10.

In some embodiments, an ALD process is used to deposit the photoresist layer. During ALD, a layer is grown on a substrate 10 by exposing the surface of the substrate to alternate gaseous compounds (or precursors). In contrast to CVD, the precursors are introduced as a series of sequential, non-overlapping pulses. In each of these pulses, the precursor molecules react with the surface in a self-limiting way, so that the reaction terminates once all the reactive sites on the surface are consumed. Consequently, the maximum amount of material deposited on the surface after a single exposure to all of the precursors (a so-called ALD cycle) is determined by the nature of the precursor-surface interaction.

In an embodiment of an ALD process, an organometallic precursor is pulsed to deliver the metal-containing precursor to the substrate 10 surface in a first half reaction. In some embodiments, the organometallic precursor reacts with a suitable underlying species (for example OH or NH functionality on the surface of the substrate) to form a new self-saturating surface. Excess unused reactants and the reaction by-products are removed, by an evacuation-pump down using a vacuum pump 245 and/or by a flowing an inert purge gas in some embodiments. Then, a second precursor, such as ammonia ($NH_3$), is pulsed to the deposition chamber in some embodiments. The $NH_3$ reacts with the organometallic precursor on the substrate to obtain a reaction product photoresist layer on the substrate surface. The second precursor also forms self-saturating bonds with the underlying reactive species to provide another self-limiting and saturating second half reaction. A second purge is performed to remove unused reactants and the reaction by-products in some embodiments. Pulses of the first precursor and second precursor are alternated with intervening purge operations until a desired thickness of the photoresist layer is achieved.

In some embodiments, each photoresist layer is formed to a thickness of about 5 nm to about 50 nm, and to a thickness of about 10 nm to about 30 nm in other embodiments. A person of ordinary skill in the art will recognize that additional ranges of thicknesses within the explicit ranges above are contemplated and are within the present disclosure. The thickness can be evaluated using non-contact methods of x-ray reflectivity and/or ellipsometry based on the optical properties of the photoresist layers. In some embodiments, each photoresist layer thickness is relatively uniform to facilitate processing. In some embodiments, the variation in thickness of the deposited photoresist layer varies by no more than ±25% from the average thickness, in other embodiments each photoresist layer thickness varies by no more than ±10% from the average photoresist layer thickness. In some embodiments, such as high uniformity depositions on larger substrates, the evaluation of the photoresist layer uniformity may be evaluated with a 1 centimeter edge exclusion, i.e., the photoresist layer uniformity is not evaluated for portions of the coating within 1 centimeter of the edge. A person of ordinary skill in the art will recognize that additional ranges within the explicit ranges above are contemplated and are within the present disclosure.

In some embodiments, the first and second compounds or precursors are delivered into the deposition chamber 205 with a carrier gas. The carrier gas, a purge gas, a deposition gas, or other process gas may contain nitrogen, hydrogen, argon, neon, helium, or combinations thereof.

In some embodiments, the organometallic compound includes tin (Sn), antimony (Sb), bismuth (Bi), indium (In), and/or tellurium (Te) as the metal component, however, the disclosure is not limited to these metals. In other embodiments, additional suitable metals include titanium (Ti), zirconium (Zr), hafnium (Hf), vanadium (V), cobalt (Co), molybdenum (Mo), tungsten (W), aluminum (Al), gallium (Ga), silicon (Si), germanium (Ge), phosphorus (P), arsenic (As), yttrium (Y), lanthanum (La), cerium (Ce), lutetium (Lu), or combinations thereof. The additional metals can be as alternatives to or in addition to the Sn, Sb, Bi, In, and/or Te.

The particular metal used may significantly influence the absorption of radiation. Therefore, the metal component can be selected based on the desired radiation and absorption cross section. Tin, antimony, bismuth, tellurium, and indium provide strong absorption of extreme ultraviolet light at 13.5 nm. Hafnium provides good absorption of electron beam and extreme UV radiation. Metal compositions including titanium, vanadium, molybdenum, or tungsten have strong absorption at longer wavelengths, to provide, for example, sensitivity to 248 nm wavelength ultraviolet light.

Figure 9:
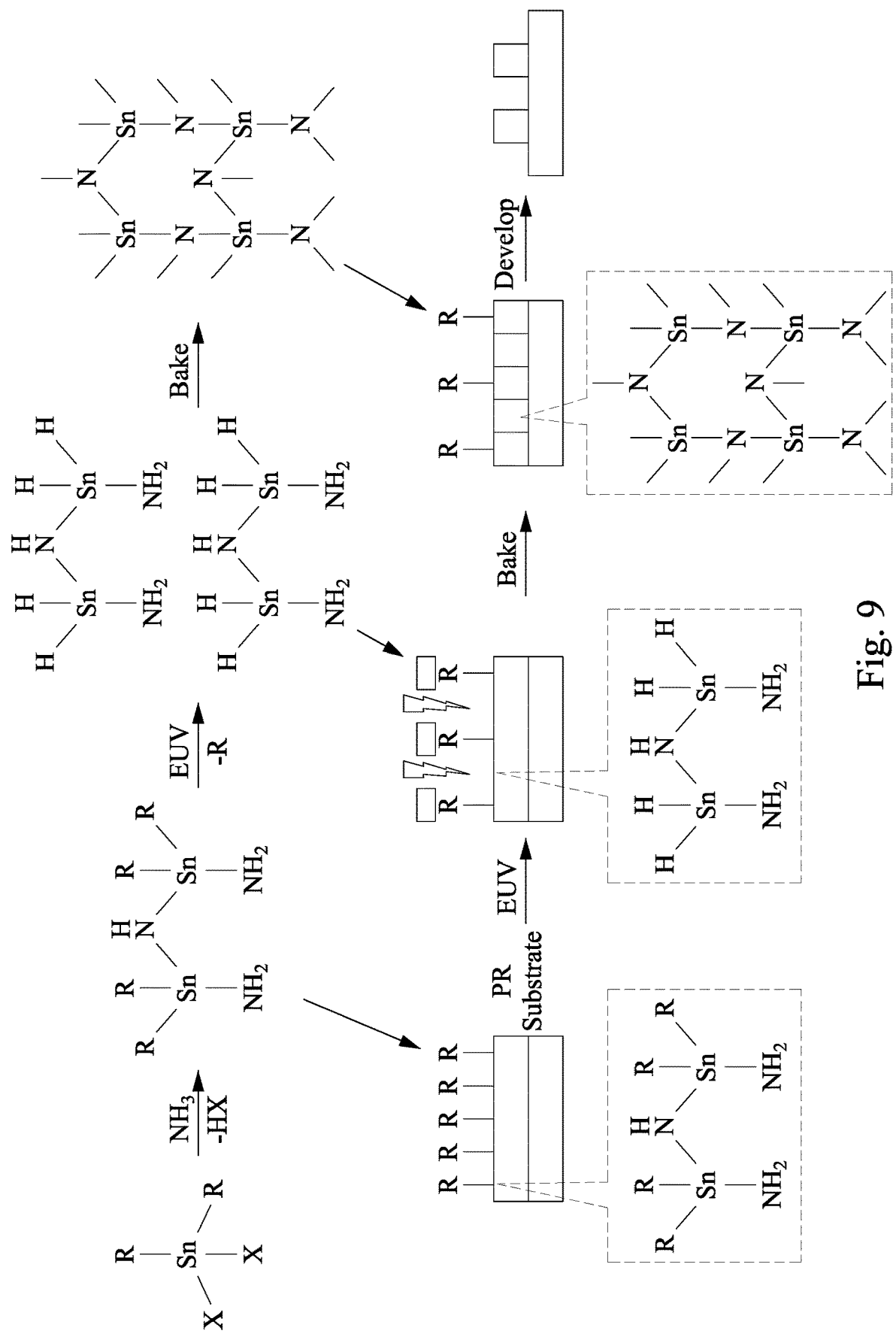
FIG. 9 shows a reaction the photoresist layer undergoes as a result of exposure to actinic radiation and heating according to an embodiment of the disclosure.

FIG. 9 shows a reaction the photoresist composition components undergo as a result of exposure to actinic radiation and heating according to an embodiment of the disclosure. FIG. 9 shows an exemplary chemical structure of the photoresist structure (PR) at various stages of the photoresist structure patterning method according to embodiments of the disclosure. As shown in FIG. 9, the photoresist composition includes an organometallic compound, for example $SnX_2R_2$, and a second compound, for example ammonia ($NH_3$). When the organometallic compound and the ammonia are combined, the organometallic compound reacts with some of the ammonia in the vapor phase to form a reaction product with amine groups attached to the metal (Sn) of the organometallic compound. The amine groups in the as deposited photoresist layer have hydrogen bonds that can substantially increase the boiling point of the deposited photoresist layer and prevent the outgassing of metal-containing photoresist material, thereby preventing contamination of the deposition chamber and semiconductor device processing equipment by the metal in the metal-containing photoresist layer. Moreover, the hydrogen bonds of the amine groups can control the effect moisture has on photoresist layer quality.

When subsequently exposed to extreme ultraviolet radiation using a mask, the organometallic compound absorbs the extreme ultraviolet radiation and one or more organic R groups are cleaved from the organometallic compound to form an amino metallic compound in the radiation exposed areas. Then, when the post-exposure bake (PEB) performed, the amino metallic compounds crosslink through the amine groups in some embodiments, as shown in FIG. 9. In some embodiments, partial crosslinking of the amino metallic compounds occurs as a result of the exposure to extreme ultraviolet radiation. The selectively exposed photoresist is subsequently developed, and the crosslinked radiation exposed pattern remains over the substrate while the radiation unexposed areas are removed during the development.

As explained above, uneven exposure of the photoresist, especially at deeper portions of the photoresist layer may result in an uneven degree of cross-linking of the photoresist, which causes poor line width roughness (LWR), a T-top resist profile and/or the formation of photoresist scum in the developed areas of the photoresist pattern. To prevent the problems resulting from uneven photoresist exposure, embodiments of the present disclosure use a multilayer or graded photoresist layer structure as the photoresist structure 15. By tuning the amount of water present during the deposition operation, varying the metal-containing resist thickness, varying flow rates of the metal resist precursors, or varying the photoresist structure heating conditions (time and temperature), a multilayer photoresist structure or graded photoresist layer 15 with different degrees of cross-linking can be formed to overcome the uneven exposure issues.

Figure 10A:
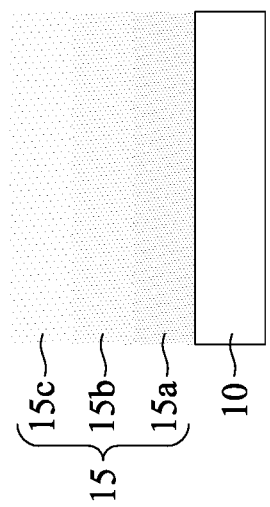
FIGS. 10A, 10B, and 10C show sequential operations according to an embodiment of the disclosure.
Figure 12C:
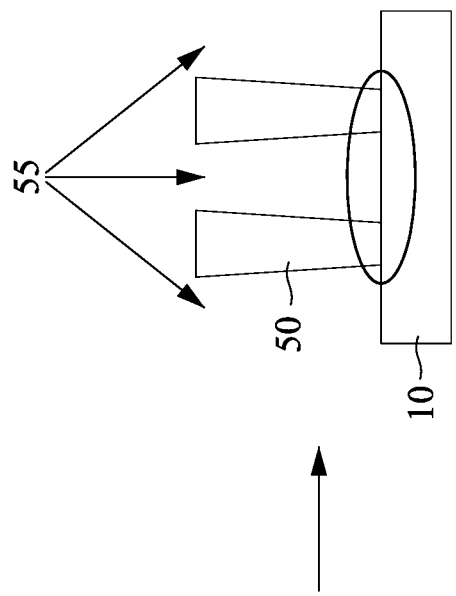
FIGS. 12A, 12B, and 12C show sequential operations according to an embodiment of the disclosure.
Figure 12B:
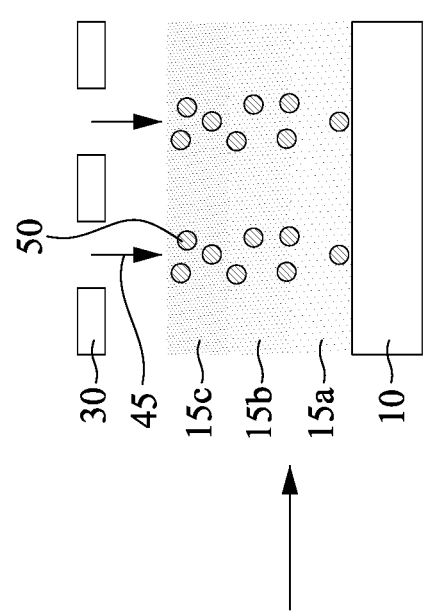
Figure 12A:
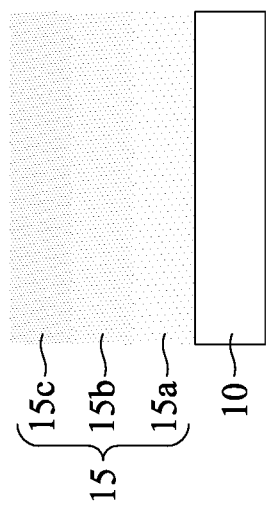
Figure 13A:
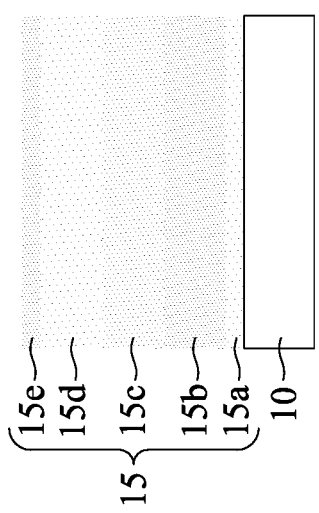
FIGS. 13A, 13B, and 13C show sequential operations according to an embodiment of the disclosure.

As shown in FIGS. 10A, 12A, and 13A, by varying the photoresist layer formation parameters, including an amount of water, varying the metal-containing resist thickness, varying the metal resist precursors, and varying the photoresist baking conditions multiple layers are formed. Some crosslinking occurs in the photoresist layers depending on the layer formation conditions, including the amount of water, the amount of metal resist precursors, and the photoresist baking/heating conditions prior to exposure to actinic radiation. Exposure to actinic radiation and post-exposure baking substantially increases the amount of crosslinking in the exposed regions of the photoresist layers, and is responsible for most of the crosslinking in some embodiments.

Figure 10B:
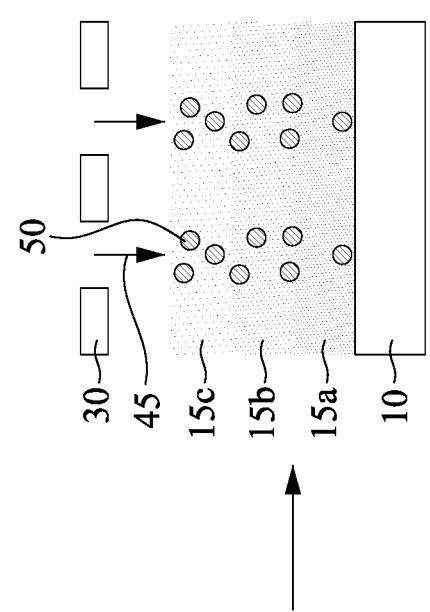
Figure 10C:
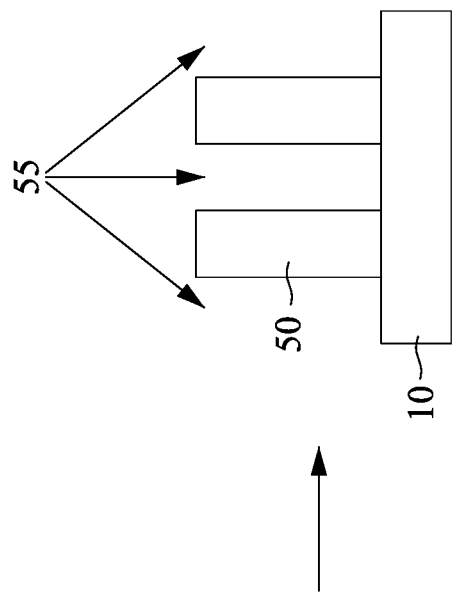

For example, in FIG. 10A, an upper layer 15c having a first crosslinking density is formed over a middle layer 15b having a second crosslinking density greater than the first crosslinking density of the upper layer 15c, which in turn is formed over a lower layer 15a having a third crosslinking density greater than the second crosslinking density of the middle layer 15b. The upper layer of a photoresist absorbs more radiation than lower layers. As shown in FIG. 10B, when the EUV light 45 passes through the multilayer photoresist structure having an upper layer 15c with a low crosslinking density and a larger energy absorption, a middle layer 15b with a medium crosslinking density and medium energy absorption, and a lower layer 15a with a high crosslinking density and lower energy absorption, the overall thickness of the exposed portions of the photoresist structure will have the same degree of crosslinking in some embodiments, thereby providing photoresist patterns 55 with improved LWR without a T-top shape, as shown in FIG. 10C.

In some embodiments, in the photoresist structure illustrated in FIGS. 10A and 10B, the upper photoresist layer 15c is thinner than the middle photoresist layer 15b, and the middle photoresist layer 15b is thinner than the lower photoresist layer 15a. In other embodiments, in the photoresist structure illustrated in FIGS. 10A and 10B, the upper photoresist layer 15c has a lower concentration of the metal resist precursors than the middle photoresist layer 15b, and the middle photoresist layer 15b has a lower concentration of the metal resist precursors than the upper photoresist layer 15a. In other embodiments, the upper photoresist layer 15c is pre-exposure baked at a lower temperature or shorter time than the middle photoresist layer 15b, and the middle photoresist layer 15b is pre-exposure baked at a lower temperature or shorter time than the lower photoresist layer 15a. In other embodiments, the amount (concentration) of the second compound or precursor in the deposition chamber during the deposition operation of the upper photoresist layer 15c is less than that during the deposition operation of the middle photoresist layer 15b, and the amount of the second compound or precursor in the deposition chamber during the deposition operation of the middle photoresist layer 15b is less than that during the deposition operation of the lower photoresist layer 15a. In some embodiments, the amount of the second compound or precursor in the deposition chamber is controlled by controlling the pressure of the second compound or precursor introduced into the deposition chamber, controlling the flowrate of the second compound or precursor introduced into the deposition chamber, or controlling the amount of time the second precursor or compound is flowing into the deposition chamber. In some embodiments, the second precursor or compound is water vapor.

In some embodiments, the degree of crosslinking or crosslinking density is determined based on the processing parameters. For example, higher concentrations or flow rates of the second compound or precursor, longer amounts of time that the second precursor or compound is flowing into the deposition chamber, higher heating temperatures, or longer time durations of heating the deposited resist layers provide higher degrees of crosslinking or higher crosslinking densities of the photoresist layers. Conversely, lower concentrations or flowrates of the second compound or precursor, shorter amounts of time that the second precursor or compound is flowing into the deposition chamber, lower heating temperatures, or shorter time durations of heating the deposited resist layers provide lower degrees of crosslinking or lower crosslinking densities of the photoresist layers.

In some embodiments, the thickness of each of the photoresist layers 15a, 15b, 15c range from about 5 nm to about 50 nm. At thicknesses below about 5 nm the photoresist layer does not have sufficient thickness to adequately perform as desired and protect the underlying substrate from subsequent processing, including etching. At thicknesses above about 50 nm, no additional performance improvement is obtained and the semiconductor manufacturing process efficiency is reduced.

In various embodiments, different methods are employed to obtain the arrangement of photoresist layers in multilayer photoresist structures, as shown in FIGS. 11A and 11B. FIGS. 11A and 11B show tables of the parameters of the photoresist layers of a multilayer photoresist structure according to embodiments of the disclosure.

In one embodiment, as shown in FIG. 11A, the multilayer photoresist structure 15 having a high crosslinking density lower layer 15a, a middle crosslinking density middle layer 15b, and a low crosslinking density upper layer 15c, corresponding to multilayer photoresist structure 15 of FIG. 10A, is formed by varying the concentration of organometallic precursor in the deposition chamber during the formation of photoresist layers. The thickness of each photoresist layer are about the same, and the water concentration in the deposition chamber is about the same. By varying the organometallic precursor concentration in the deposition chamber during the formation of the photoresist layers, so that the upper layer 15c is formed at a lower concentration of the organometallic precursor, the middle layer 15b is formed at a greater concentration of organometallic precursor than the upper layer 15c, and the lower layer 15a is formed at a greater concentration of the organometallic precursor than the middle layer 15b, the desired crosslinking density of the various layers is obtained. In some embodiments, the concentration of the organometallic precursor of the various layers and the degree of crosslinking or crosslinking density is determined based on the processing parameters. For example, higher concentrations or flowrates of the first compound or precursor or longer amounts of time that the first precursor or compound is flowing into the deposition chamber provide higher organometallic precursor concentrations and higher degrees of crosslinking or higher crosslinking densities of the photoresist layers. Conversely, lower concentrations or flowrates of the first compound or precursor or shorter amounts of time that the second precursor or compound is flowing into the deposition chamber provide lower organometallic precursor concentrations and lower degrees of crosslinking or lower crosslinking densities of the photoresist layers. The greater the concentration of the organometallic precursor in the deposition chamber during the formation of the photoresist layer the greater the amount of organometallic precursor that can undergo crosslinking during the photoresist layer formation.

In another embodiment, as shown in FIG. 11B, the multilayer photoresist structure 15 having a high crosslinking density lower layer 15a, a middle crosslinking density middle layer 15b, and a low crosslinking density upper layer 15c, corresponding to the multilayer photoresist structure 15 of FIG. 10A, is formed by varying the water concentration in the photoresist deposition chamber. The thickness of each photoresist layer are about the same, and the metal concentration in each photoresist layer is about the same. By varying the water concentration in the photoresist deposition chamber, so that the upper layer 15c is formed at a lower water concentration, the middle layer 15b is formed at a greater water concentration than the formation of the upper layer 15c, and the lower layer 15a is formed at a greater concentration than the formation of the middle layer 15b, the desired crosslinking density of the various layers is obtained.

In some embodiments, the amount of water in the deposition chamber is controlled to maintain a water vapor concentration of less than about 10 wt. % of the total weight of the water vapor and the other reactant precursors or compounds for forming the photoresist layers in the deposition chamber. In some embodiments, the water vapor concentration ranges from about 0.1 wt. % to about 10 wt. % based on the total amount of water and the reactant precursors or compounds. In some embodiments, the mole ratio of the metal-containing precursor or compound to water ranges from about 1:0.1 to about 1:2. The higher the water vapor concentration, the higher is the degree of crosslinking or crosslinking density of the photoresist layers. Conversely, lower water vapor concentrations provide lower degrees of crosslinking or crosslinking densities of the photoresist layers. If the water vapor concentration is above about 10% the photoresist structure LWR decreases. If the water vapor concentration is less than about 0.1% there may be insufficient crosslinking in the photoresist structure. If there is too little crosslinking, portions of the exposed regions, which are not supposed to be removed during the development operation, may be removed during the development operation and the resulting pattern does not have the desired definition. If there is too much crosslinking in portions of the unexposed regions, which are supposed to be removed during the development operation, may not be removed and the resulting pattern does not have the desired definition.

In some embodiments, the degree of crosslinking or crosslinking density is determined based on the processing parameters. For example, higher concentrations or flowrates of water vapor or longer amounts of time that the water vapor is flowing into the deposition chamber provide higher degrees of crosslinking or higher crosslinking densities of the photoresist layers. Conversely, lower concentrations or flowrates of water vapor or shorter amounts of time that the water vapor is flowing into the deposition chamber provide lower degrees of crosslinking or lower crosslinking densities of the photoeresist layers.

In another embodiment, as shown in FIGS. 12A-12C, by varying photoresist layer formation parameters, including the concentration of $H_2O$, varying the metal-containing resist layer thickness, varying the metal resist precursors, and varying the photoresist layer baking conditions, the upper photoresist layer 15c has the highest crosslinking density and the lower photoresist layer 15a has the lowest crosslinking density. The higher crosslinking density of the upper photoresist layer 15c prevents the outgas sing problem in some embodiments. The low crosslinking density of the lower photoresist layer 15a on the bottom of the multilayer photoresist structure 15 is more easily dissolved/removed by the developer, thereby reducing scum defects.

For example, in FIG. 12A, an upper layer 15c having a first crosslinking density is formed over a middle layer 15b having a second crosslinking density less than the first crosslinking density of the upper layer 15c, which in turn is formed over a lower layer 15a having a third crosslinking density less than the second crosslinking density of the middle layer 15b. The upper layer of a photoresist absorbs more radiation than lower layers. As shown in FIG. 12B, when the EUV light 45 passes through the multilayer photoresist structure having an upper layer 15c with a high crosslinking density and a larger energy absorption, a middle layer 15b with a medium crosslinking density and medium energy absorption, and a lower layer 15a with a low crosslinking density and lower energy absorption, the overall thickness of the exposed portions of the photoresist structure will have a cross-linking gradient ranging from high degree of crosslinking in the uppermost photoresist layer to a low degree of crosslinking in the lowermost photoresist layer in some embodiments. This structure provides photoresist patterns 55 with a higher density upper layer that prevents photoresist outgassing and subsequent contamination in the deposition chamber, and a lower density lower layer that enables improved development of the lower photoresist layer and prevents photoresist scum formation in the lower photoresist layers, as shown in FIG. 12C. In some embodiments, the patterned photoresist features have a wider width at the upper portion of the photoresist pattern 50 than at the lower portion of the photoresist pattern 50 because of the higher crosslinking density in the upper portion and the lower crosslinking density in the lower portion, as shown in FIG. 12C. In some embodiments, the degree of crosslinking in each photoresist layer is controlled so that a desired resist profile is obtained. If the difference in crosslinking between the upper and lower photoresist layers is too great, the resulting taper of the patterned resist profile may be too great. In some embodiments, the middle layer between the upper resist layer and the lower resist layer improves the adhesion between the upper and lower resist layers.

In some embodiments, in the photoresist structure illustrated in FIGS. 12A and 12B, the upper photoresist layer 15c is thicker than the middle photoresist layer 15b, and the middle photoresist layer 15b is thicker than the lower photoresist layer 15a. In other embodiments, in the photoresist structure illustrated in FIGS. 12A and 12B, the upper photoresist layer 15c has a higher concentration of the metal resist precursors than the middle photoresist layer 15b, and the middle photoresist layer 15b has a higher concentration of the metal resist precursors than the lower photoresist layer 15a. In other embodiments, the upper photoresist layer 15c is pre-exposure baked at a higher temperature or longer time than the middle photoresist layer 15b, and the middle photoresist layer 15b is pre-exposure baked at a higher temperature or longer time than lower photoresist layer 15a. In other embodiments, the amount of the second compound or precursor in the deposition chamber is greater during the deposition operation of the upper photoresist layer 15c than during the deposition operation of the middle photoresist layer 15b, and the amount of the second compound or precursor in the deposition chamber during the deposition operation of the middle photoresist layer 15b is greater than during the deposition operation of the lower photoresist layer 15a.

Figure 13B:
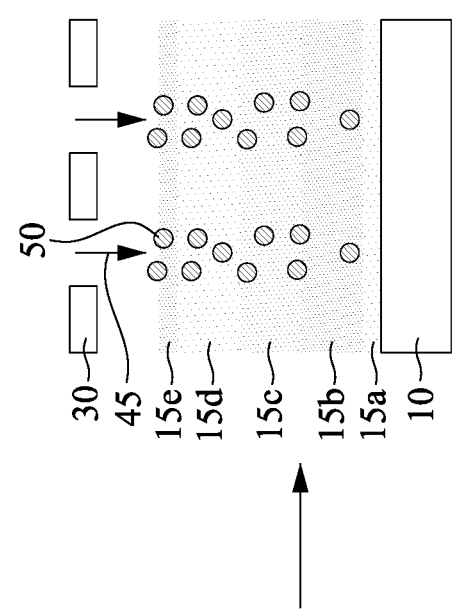
Figure 13C:
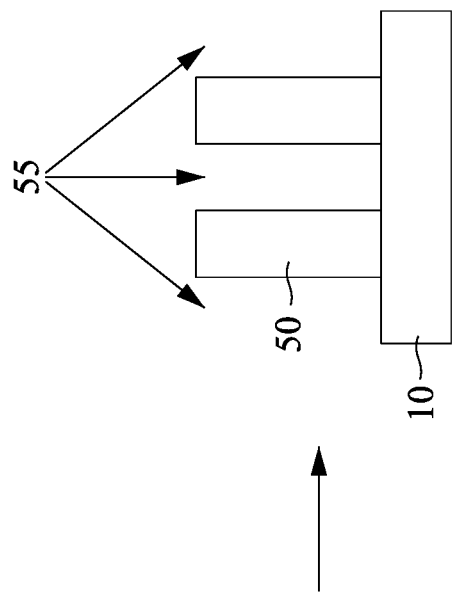

In another embodiment, as shown in FIGS. 13A-13C, the multilayer photoresist structure 15 includes multiple photoresist layers 15a, 15b, 15c, 15d, 15e having different crosslinking densities and thicknesses to eliminate scum and provide improved LWR. Adjusting the photoresist layer formation parameters, as disclosed herein, to address T-top formation may not address scum defects and photoresist outgas sing in some embodiments. On the other hand, adjusting the photoresist layer formation parameters, as disclosed herein, to address scum defects and photoresist outgassing issues may not address T-top formation in some embodiments. Therefore, in some embodiments, multiple photoresist layers having different crosslinking densities are formed and arranged to eliminate scum and outgassing, while providing improved LWR. For example, in some embodiments, a bottom layer 15a having a first thickness and a first crosslinking density is formed over a substrate 10. Then, three middle layers 15b, 15c, 15d are formed over the bottom layer 15a. The three middle layers 15b, 15c, 15d are similar to the three photoresist layers formed in the embodiment of FIGS. 10A-10C. The upper middle layer 15d having a second crosslinking density and a second thickness is formed over the second middle layer 15c having a third crosslinking density greater than the second crosslinking density of the upper middle layer 15d, which in turn is formed over the lower middle layer 15b having a fourth crosslinking density greater than the third crosslinking density of the second middle layer 15c and having a fourth thickness. A top layer 15e having a fifth crosslinking density and a fifth thickness is formed over the upper middle layer 15d.

The fifth crosslinking density of the top layer 15e is greater than the first crosslinking density of the bottom layer 15a, second crosslinking density of the upper middle layer 15d, and third crosslinking density of the second middle layer 15c. The first crosslinking density of the bottom layer 15a is less than the third crosslinking density of the second middle layer 15c, fourth crosslinking density of the lower middle layer 15b, and the fifth crosslinking density of the top layer 15e. In some embodiments, the first thickness of the bottom layer 15a is less than the second thickness of the upper middle layer 15d, the third thickness of the second middle layer 15c, and the fourth thickness of the lower middle layer 15b. In some embodiments, the fifth thickness of the top layer 15e is less than the second thickness of the upper middle layer 15d, the third thickness of the second middle layer 15c, and the fourth thickness of the lower middle layer 15b.

In some embodiments, the first thickness of the bottom layer 15a and the fifth thickness of the top layer 15e independently range from about 0.5 nm to about 45 nm. In some embodiments, the second thickness of the upper middle layer 15d, third thickness of the second middle layer 15c, and the fourth thickness of lower middle layer 15b independently range from about 5 nm to about 50 nm.

In some embodiments of the disclosure, rather than forming separate discrete photoresist layers, the photoresist structure 15 is formed as one continuous layer where the photoresist deposition parameters are varied during the photoresist layer deposition to produce a photoresist layer having a gradient crosslinking density across the thickness of the photoresist layer. In some embodiments, the crosslinking density of the photoresist continuously varies from a maximum crosslinking density at the photoresist layer 15/substrate 10 interface to a minimum crosslinking density at the upper surface of the photoresist layer 15. In other embodiments, the crosslinking density of the photoresist continuously varies from a minimum crosslinking density at the photoresist layer 15/substrate 10 interface to a maximum crosslinking density at the upper surface of the photoresist layer 15.

As shown in FIG. 13B, the multilayer photoresist structure 15 is patternwise exposed to EUV light 45. The high crosslinking density of the top photoresist layer 15e reduces or prevents outgassing of the photoresist multilayer structure 15 and the subsequent contamination of the semiconductor device processing chambers and tools. The low crosslinking density of the bottom photoresist layer 15a reduces or prevents scum defects, as shown in FIG. 13C. Further, as shown in FIG. 13C, the three middle layers 15b, 15c, 15d arranged in order from the lower middle layer up having decreasing crosslinking densities to provide about the same degree of crosslinking after exposure to actinic radiation to obtain improved LWR similar to the embodiment of FIGS. 10A-10C.

Figure 14:
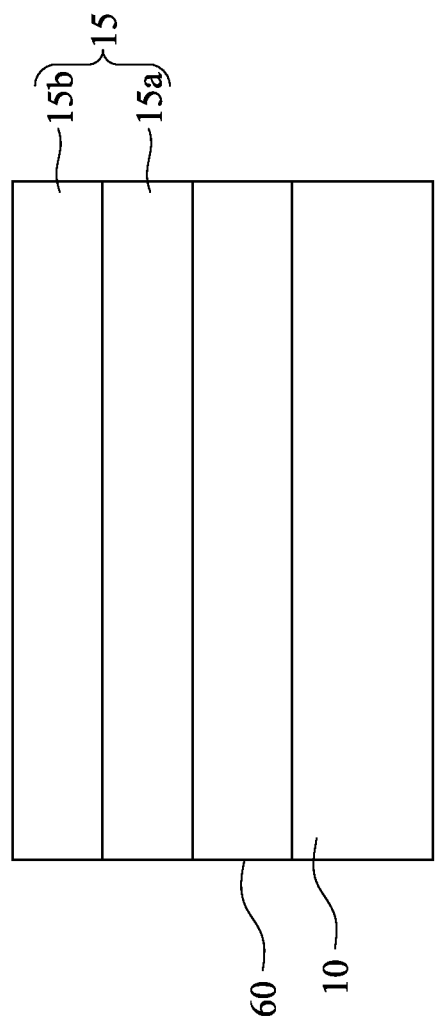
FIG. 14 shows a process stage of a sequential operation according to an embodiment of the disclosure.

In some embodiments, a layer to be patterned 60 is disposed over the substrate prior to forming the multilayer photoresist structure 15, as shown in FIG. 14. In some embodiments, the layer to be patterned 60 is a metallization layer or a dielectric layer, such as a passivation layer, disposed over a metallization layer. In embodiments where the layer to be patterned 60 is a metallization layer, the layer to be patterned 60 is formed of a conductive material using metallization processes, and metal deposition techniques, including chemical vapor deposition, atomic layer deposition, and physical vapor deposition (sputtering). Likewise, if the layer to be patterned 60 is a dielectric layer, the layer to be patterned 60 is formed by dielectric layer formation techniques, including thermal oxidation, chemical vapor deposition, atomic layer deposition, and physical vapor deposition.

Figure 15A:
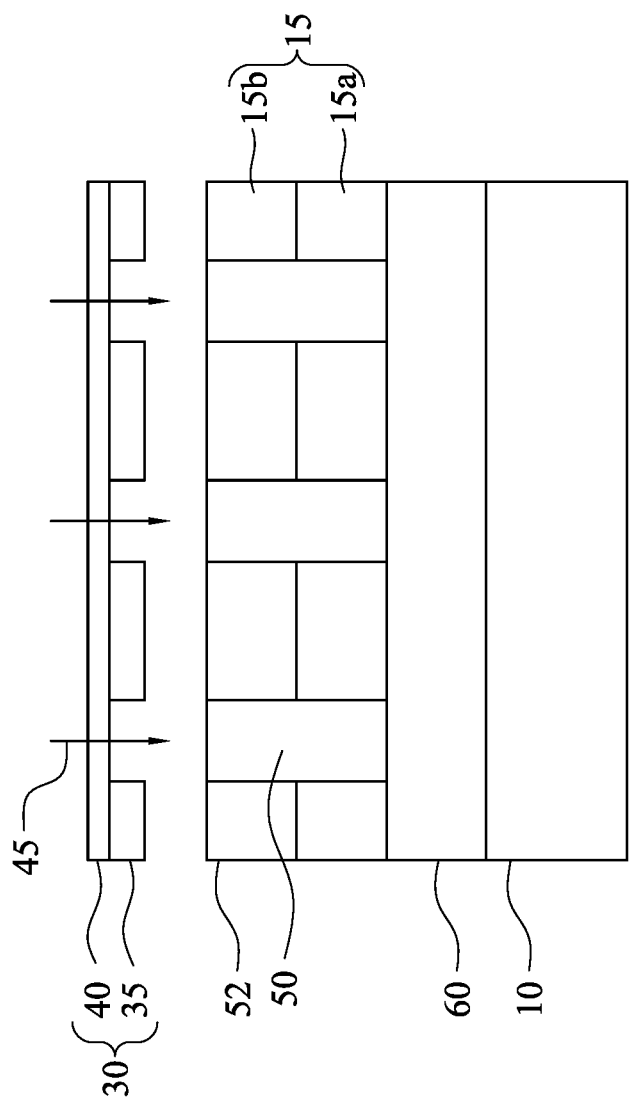
FIGS. 15A and 15B show a process stage of a sequential operation according to an embodiment of the disclosure.
Figure 15B:
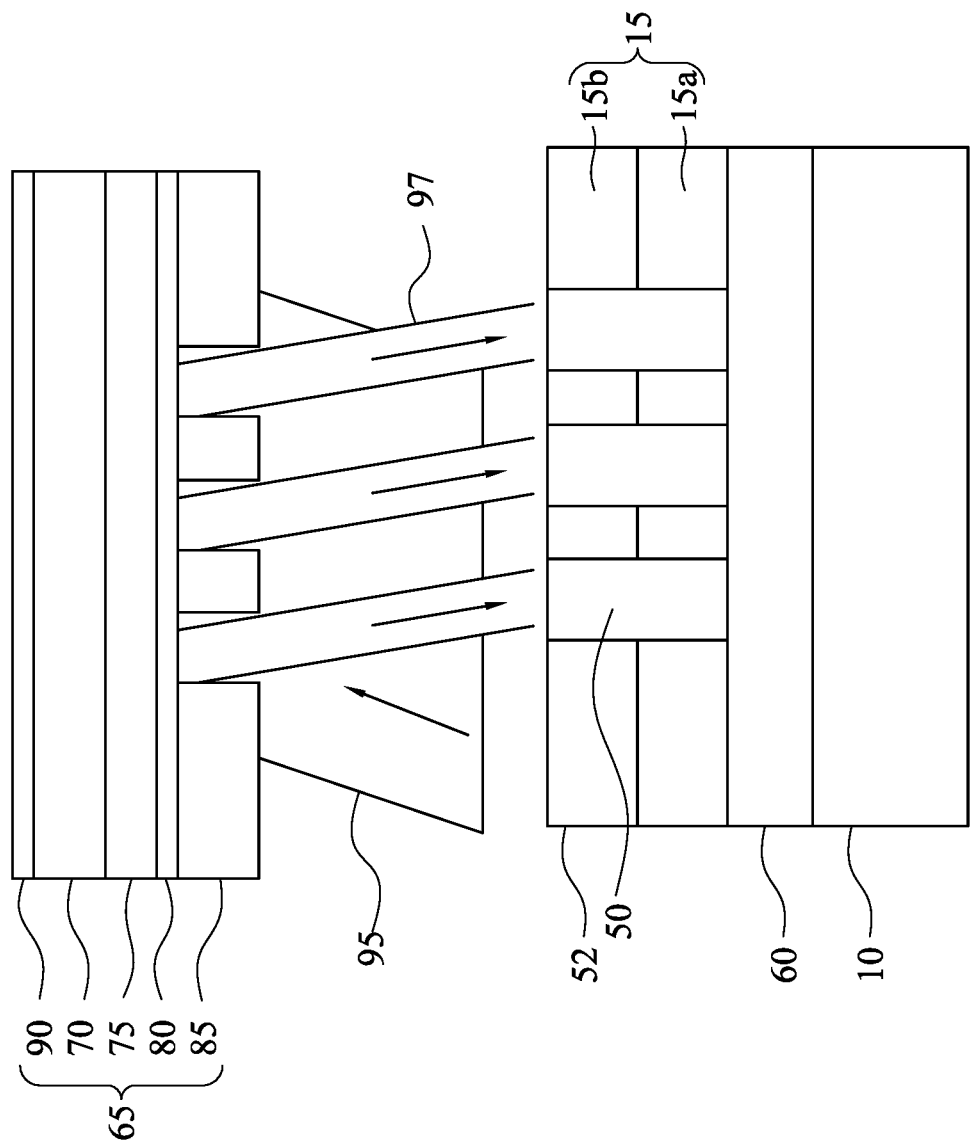

The multilayer photoresist structure 15 is subsequently selectively exposed to actinic radiation 45 to form exposed regions 50 and unexposed regions 52 in the multilayer photoresist structure, as shown in FIGS. 15A and 15B, and described herein in relation to FIGS. 3A and 3B. As explained herein, the photoresist layers 15a, 15b are negative-tone photoresists in some embodiments.

Figure 16B:
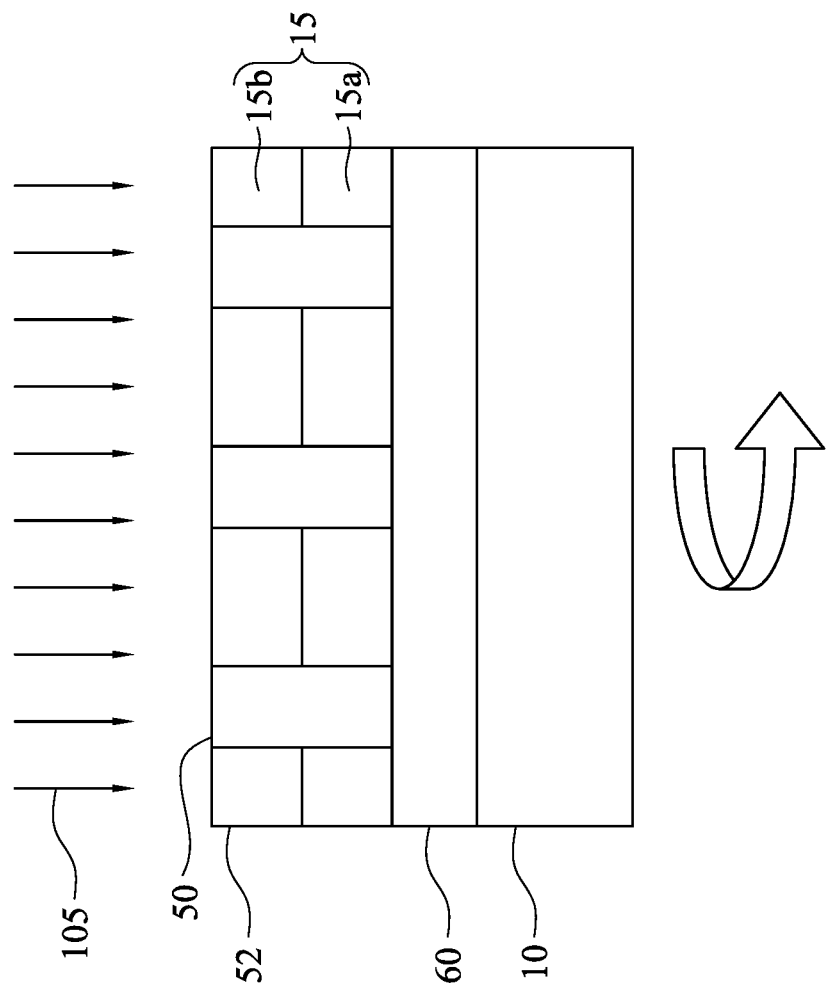
Figure 17:
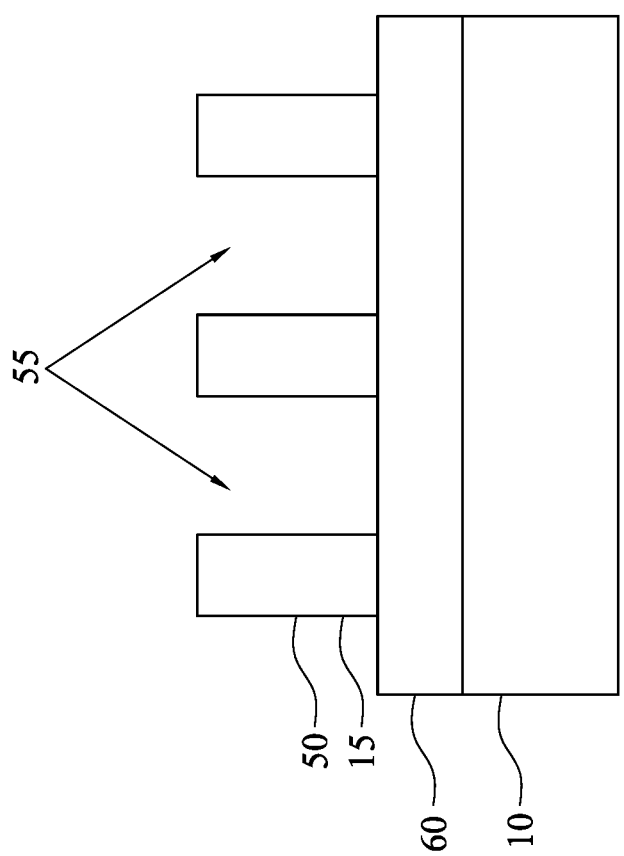
FIG. 17 shows a process stage of a sequential operation according to an embodiment of the disclosure.

The unexposed photoresist regions 52 are developed by dispensing developer 57 from a dispenser 62, as shown in FIG. 16A, or by a dry development operation, as shown in FIG. 16B to form a photoresist pattern 55, as shown in FIG.

17. The development operation is similar to that explained herein with reference to FIGS. 4A, 4B, and 5.

Figure 18:
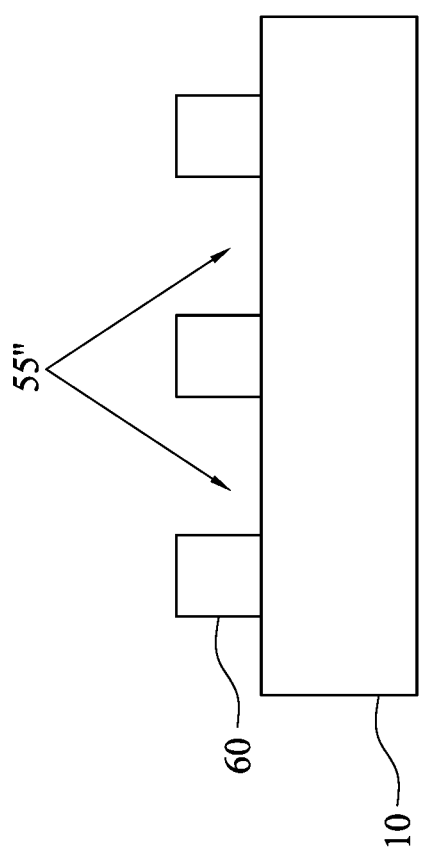
FIG. 18 shows a process stage of a sequential operation according to an embodiment of the disclosure.

Then as shown in FIG. 18, the pattern 55 in the multilayer photoresist structure 15 is transferred to the layer to be patterned 60 using an etching operation and the multilayer photoresist structure is removed, as explained with reference to FIG. 6 to form pattern 55" in the layer to be patterned 60.

Other embodiments include other operations before, during, or after the operations described above. In some embodiments, the disclosed methods include forming fin field effect transistor (FinFET) structures. In some embodiments, a plurality of active fins are formed on the semiconductor substrate. Such embodiments, further include etching the substrate through the openings of a patterned hard mask to form trenches in the substrate; filling the trenches with a dielectric material; performing a chemical mechanical polishing (CMP) process to form shallow trench isolation (STI) features; and epitaxy growing or recessing the STI features to form fin-like active regions. In some embodiments, one or more gate electrodes are formed on the substrate. Some embodiments include forming gate spacers, doped source/drain regions, contacts for gate/source/drain features, etc. In other embodiments, a target pattern is formed as metal lines in a multilayer interconnection structure. For example, the metal lines may be formed in an inter-layer dielectric (ILD) layer of the substrate, which has been etched to form a plurality of trenches. The trenches may be filled with a conductive material, such as a metal; and the conductive material may be polished using a process such as chemical mechanical planarization (CMP) to expose the patterned ILD layer, thereby forming the metal lines in the ILD layer. The above are non-limiting examples of devices/structures that can be made and/or improved using the method described herein.

In some embodiments, active components such diodes, field-effect transistors (FETs), metal-oxide semiconductor field effect transistors (MOSFET), complementary metal-oxide semiconductor (CMOS) transistors, bipolar transistors, high voltage transistors, high frequency transistors, FinFETs, other three-dimensional (3D) FETs, other memory cells, and combinations thereof are formed, according to embodiments of the disclosure.

By tuning the amount of the second compound or precursor, such as water, varying the metal-containing photoresist thickness, the metal-containing photoresist precursors, and the time and temperature of the photoresist baking conditions, the merged multilayer photoresist structure with different degrees of cross-linking is formed to overcome uneven exposure issues. The photoresist layer structures and patterning methods of the present disclosure prevent T-top resist pattern profiles, reduces scum defects, and prevent outgassing and subsequent contamination of the semiconductor manufacturing processing tools. Embodiments of the disclosure provide improved line width roughness and improved distinction between exposed and unexposed portions of the photoresist. Embodiments of the present disclosure provide increased semiconductor device yields.

An embodiment of the disclosure is method of manufacturing a semiconductor device includes forming a multilayer photoresist structure including a metal-containing photoresist over a substrate. The multilayer photoresist structure includes two or more metal-containing photoresist layers having different physical parameters. The metal-containing photoresist is a reaction product of a first precursor and a second precursor, and each layer of the multilayer photoresist structure is formed using different photoresist layer formation parameters. The different photoresist layer formation parameters are one or more selected from the group consisting of the first precursor, an amount of the first precursor, the second precursor, an amount of the second precursor, a length of time of each photoresist layer formation operation, and heating conditions of the photoresist layers. The multilayer photoresist structure is selectively exposed to actinic radiation to form a latent pattern, and the latent pattern is developed by applying developer to the selectively exposed multilayer photoresist structure to form the pattern. In an embodiment, the actinic radiation is extreme ultraviolet radiation. In an embodiment, the method includes after selectively exposing the multilayer photoresist structure to actinic radiation to form a latent pattern and before developing the latent pattern, post-exposure heating the multilayer photoresist structure at a temperature ranging from 50° C. to 250° C. In an embodiment, the method includes heating each photoresist layer at a temperature ranging from 50° C. to 200° C. after forming each layer. In an embodiment, the different physical parameters of the photoresist layer include different photoresist layer crosslinking densities or different photoresist layer thicknesses. In an embodiment, the multilayer photoresist structure is formed by chemical vapor deposition (CVD) or atomic layer deposition (ALD). In an embodiment, the multilayer photoresist structure includes a first photoresist layer overlying the substrate, and a second photoresist layer overlying the first photoresist layer, the photoresist layers are reaction products of a first precursor and a second precursor, the first photoresist layer is formed by combining the first precursor and the second precursor having a first concentration, and the second photoresist layer is formed by combining the first precursor and the second precursor having a second concentration, wherein the first and second concentrations of the second precursor are different. In an embodiment, the method includes forming a third photoresist layer over the second photoresist layer, wherein the third photoresist layer is formed by combining the first precursor and the second precursor having a third concentration, and the third concentration is different from the first and second concentrations. In an embodiment, an amount of $H_2O$ present during the forming a multilayer photoresist structure over a substrate is varied to provide the two or more photoresist layers having different physical parameters. In an embodiment, the two or more photoresist layers have different thicknesses. In an embodiment, the method includes performing a heating operation after each photoresist layer of the two or more photoresist layers is formed.

Another embodiment of the disclosure is a method of forming a pattern, including forming a first resist layer having a first physical parameter over a substrate, and forming a second resist layer having a second physical parameter over the first resist layer. The first and second physical parameters are different. The first and second resist layers are patternwise crosslinked, and portions of the first and second resist layers not crosslinked are removed to form a pattern in the first and second resist layers. The first and second resist layers are reaction products of a first metal-containing precursor and a second precursor. The first resist layer and the second resist layer are formed using different resist layer formation parameters. The different resist layer formation parameters are one or more selected from the group consisting of the first metal-containing precursor, an amount of the first metal-containing precursor, the second precursor, an amount of the second precursor, a length of time of each resist layer formation operation, and heating conditions of the resist layers. In an embodiment, the method includes forming a third resist layer, having a third physical parameter over the second resist layer, wherein the third physical parameter is different from the first and second physical parameters. In an embodiment, the first and second physical parameters are crosslinking densities of the first and second resist layers. In an embodiment, the first and second physical parameters are thicknesses of the first and second resist layers. In an embodiment, the method includes heating the first and second resist layers after forming each of the resist layers. In an embodiment, portions of the first and second resist layers not crosslinked are removed by a dry etching operation. In an embodiment, the first and second resist layers are formed by atomic layer deposition (ALD) or chemical vapor deposition (CVD). In an embodiment, the patternwise crosslinking the first and second resist layers includes patternwise exposing the first and second resist layers to actinic radiation, and heating the first and second resist layers after the patternwise exposing. In an embodiment, the actinic radiation includes extreme ultraviolet radiation or an electron beam. In an embodiment, the heating the first and second resist layers is at a temperature ranging from 50° C. to 250° C.

Another embodiment of the disclosure is a method of forming a pattern, including forming a first photoresist layer over a substrate by depositing a first photoresist composition in a first vapor phase deposition operation at a first deposition parameter, and forming a second photoresist layer over the first photoresist layer by depositing a second photoresist composition in a second vapor phase deposition operation at a second deposition parameter. The first deposition parameter is different from the second deposition parameter. The first deposition parameter and the second deposition parameter are one or more selected from the group consisting of an amount of the first photoresist composition, an amount of the second composition, a length of time of each photoresist layer formation operation, pressure, vapor flow rate, and heating conditions of the photoresist layers. The first and second photoresist layers are selectively exposed to actinic radiation to form a latent pattern. The latent pattern is developed by applying a developer to the selectively exposed first and second photoresist layers to form the pattern. In an embodiment, the first and second vapor phase deposition operations are atomic layer deposition (ALD) or chemical vapor deposition (CVD). In an embodiment, the method includes forming a third photoresist layer over the second photoresist layer by a third vapor phase deposition operation at a third deposition parameter, wherein the third deposition parameter is different from the first and second deposition parameters. In an embodiment, an amount of the third deposition parameter is between an amount of the first deposition parameter and an amount of the second deposition parameter. In an embodiment, the actinic radiation is extreme ultraviolet radiation or an electron beam. In an embodiment, the method includes after selectively exposing the first and second photoresist layers to actinic radiation to form a latent pattern and before developing the latent pattern, post-exposure heating the first and second photoresist layers at a temperature ranging from 50° C. to 250° C. In an embodiment, the first and second photoresist layers include metal-containing photoresist compositions. In an embodiment, the first and second photoresist layers have different thicknesses. In an embodiment, the first and second photoresist layers have different crosslinking densities.

Another embodiment of the disclosure is a method of manufacturing a semiconductor device, including forming a first photoresist layer over a substrate by a vapor phase deposition operation at a first water vapor concentration in a deposition chamber. A second photoresist layer is formed over the first photoresist layer by a second vapor phase deposition operation at a second water vapor concentration in the deposition chamber. The first water vapor concentration and the second water vapor concentration are different. The first and second photoresist layers are selectively exposed to actinic radiation to form a latent pattern. The latent pattern is developed by applying a developer to the selectively exposed first and second photoresist layers to form a pattern. In an embodiment, the second water vapor concentration is greater than the first water vapor concentration. In an embodiment, the first water vapor concentration is greater than the second water vapor concentration. In an embodiment, the method includes forming a third photoresist layer over the second photoresist layer by a third vapor phase deposition operation at a third water vapor concentration, wherein the third water vapor concentration is different from the first water vapor concentration and the second water vapor concentration. In an embodiment, the second water vapor concentration is greater than the first water vapor concentration, and the third water vapor concentration is greater than the second water vapor concentration. In an embodiment, the first water vapor concentration is greater than the second water vapor concentration, and the second water vapor concentration is greater than the third water vapor concentration. In an embodiment, the deposition chamber is an atomic layer deposition chamber or a chemical vapor deposition chamber. In an embodiment, the developer is a plasma etchant. In an embodiment, the method includes etching exposed portions of the substrate after developing the latent pattern.

Another embodiment of the disclosure is a method of manufacturing a semiconductor device, includes depositing a reaction product of an organometallic precursor and a second precursor over a substrate to form a first resist layer having a first concentration of the second precursor over the substrate. A reaction product of an organometallic precursor and a second precursor is deposited over the first resist layer to form a second resist layer having a second concentration of the second precursor. The second concentration is different from the first concentration. The organometallic precursors each independently have a formula: $M_aR_bX_c$, where M is one or more selected from the group consisting of Sn, Bi, Sb, In, and Te; R is a substituted or unsubstituted alkyl, alkenyl, or carboxylate group; X is a halide or sulfonate group; and $1 \leq a \leq 2$, $b \geq 1$, $c \geq 1$, and $b+c \leq 5$. The second precursors are each independently selected from the group consisting of water, an amine, a borane, and a phosphine. The first and second resist layers are patternwise crosslinked to form a latent pattern in the first and second resist layers. The latent pattern is developed by applying a developer to the patternwise crosslinked first and second resist layers to form a pattern exposing a portion of the substrate. In an embodiment, the second concentration is greater than the first concentration. In an embodiment, the first concentration is greater than the second concentration. In an embodiment, the method includes depositing a reaction product of the organometallic precursor and the second precursor over the second resist layer before the patternwise crosslinking to form a third resist layer having a third concentration of the second precursor over the second resist layer, wherein the third concentration is different from the first concentration and the second concentration. In an embodiment, the second concentration is greater than the first concentration, and the third concentration is greater than the first concentration. In an embodiment, the first concentration is greater than the second concentration, and the second concentration is greater than the third concentration. In an embodiment, the first, second, and third resist layers are formed of a same organometallic precursor. In an embodiment, the first, second, and third resist layers are formed of a same second precursor. In an embodiment, the patternwise crosslinking the resist layer includes patternwise exposing the first and second resist layers to extreme ultraviolet radiation, and heating the patternwise exposed first and second resist layers. In an embodiment, the heating is performed at a temperature ranging from 50° C. to 250° C. In an embodiment, the amine is ammonia or hydrazine. In an embodiment, the amine, borane, or phosphine includes a halide substituent.

Another embodiment is a method of manufacturing a semiconductor device, including depositing a reaction product of an organometallic precursor and a second precursor over a substrate by a vapor deposition operation to form a first photoresist layer having a first concentration of the second precursor over the substrate. A reaction product of an organometallic precursor and a second precursor is deposited over the first photoresist layer by a vapor deposition operation to form a second photoresist layer having a second concentration of the second precursor over the first photoresist layer. The second concentration is different from the first concentration. The organometallic precursors each independently have a formula: $M_aR_bX_c$, where M is one or more selected from the group consisting of Sn, Bi, Sb, In, and Te; R is a substituted or unsubstituted alkyl, alkenyl, or carboxylate group; X is a halide or sulfonate group; and $1 \le a \le 2$, $b \ge 1$, $c \ge 1$, and $b+c \le 5$. The second precursors are each independently selected from the group consisting of water, an amine, a borane, and a phosphine. The first and second photoresist layers are selectively exposed to actinic radiation to form a latent pattern in the first and second photoresist layers. The latent pattern is developed by applying a developer to the selectively exposed first and second resist layers to form a pattern exposing a portion of the substrate. In an embodiment, the method includes depositing a reaction product of the organometallic precursor and the second precursor over the second photoresist layer by a vapor deposition operation to form a third photoresist layer having a third concentration of the second precursor before the selectively exposing the first and second photoresist layers, wherein the third concentration is different than the first and second concentrations. In an embodiment, the method includes after the selectively exposing, heating the first, second, and third photoresist layers at a temperature ranging from 50° C. to 250° C. before developing the latent pattern. In an embodiment, the vapor deposition operations are selected from the group consisting of chemical vapor deposition and atomic layer deposition. In an embodiment, the method includes heating the first, second, and third photoresist layer at temperature ranging from 50° C. to 200° C. after forming each of the first, second, and third photoresist layers and before the selectively exposing. In an embodiment, the first, second, and third photoresist layers have different thicknesses. In an embodiment, X is a sulfonate group substituted with one or more amine groups. In an embodiment, the alkyl, alkenyl, or carboxylate group is substituted with one or more fluoro groups. In an embodiment, the amine, borane, or phosphine includes a halide substituent. In an embodiment, the actinic radiation is extreme ultraviolet radiation or an electron beam.

Another embodiment of the disclosure is a method of manufacturing a semiconductor device, including depositing a first photoresist layer over a substrate via atomic layer deposition (ALD) or chemical vapor deposition (CVD), and depositing a second photoresist layer over the first photoresist layer via ALD or CVD. The first photoresist layer includes a first photoresist composition including a first reaction product of a first compound and a second compound, and the second photoresist layer includes a second photoresist composition including a second reaction product of the first compound and the second compound. The first compounds are independently selected from the group consisting of a t-butyl tris(dimethylamino) tin, i-butyl tris(dimethylamino) tin, n-butyl tris(dimethylamino) tin, sec-butyl tris(dimethylamino) tin, i-propyl(tris)dimethylamino tin, n-propyl tris(diethylamino) tin, t-butyl tris(t-butoxy) tin, i-butyl tris(butoxy) tin, n-butyl tris(butoxy) tin, sec-butyl tris(butoxy) tin, i-propyl(tris)dimethylamino tin, and n-propyl tris(butoxy) tin. The second compounds are independently selected from the group consisting of water, an amine, a borane, and a phosphine. A concentration of the second compound in the first photoresist composition is different from a concentration of the second compound in the second photoresist composition. The first and second photoresist layers are selectively exposed to actinic radiation to form a latent pattern. The latent pattern is developed by applying a developer to the selectively exposed first and second photoresist layers to form a pattern exposing a portion of the substrate. In an embodiment, the method includes removing a portion of the substrate exposed by the developing. In an embodiment, the removing a portion of the substrate by the developing includes etching the substrate. In an embodiment, the actinic radiation is extreme ultraviolet radiation or an electron beam. In an embodiment, the method includes after selectively exposing the first and second photoresist layers to actinic radiation to form a latent pattern and before developing the latent pattern, heating the first and second photoresist layers at a temperature ranging from 50° C. to 250° C. In an embodiment, the first compounds are substituted with one or more fluoro groups. In an embodiment, the first compound in the first photoresist composition is same as the first compound in the second photoresist composition. In an embodiment, the second compound in the first photoresist composition is same as the second compound in the second photoresist composition. In an embodiment, the method includes depositing a third photoresist layer over the second photoresist layer via ALD or CVD, wherein the third photoresist layer comprises a third photoresist composition comprising a third reaction product of the first compound and the second compound, and a concentration of the second compound in the third photoresist composition is greater than the concentration of the second compound in the second photoresist composition, and the concentration of the second compound in the second photoresist composition is greater than the concentration of the second compound in the first photoresist composition. In an embodiment, the method includes depositing a third photoresist layer over the second photoresist layer via ALD or CVD, wherein the third photoresist layer comprises a third photoresist composition comprising a third reaction product of the first compound and the second compound, and a concentration of the second compound in the third photoresist composition is less than the concentration of the second compound in the second photoresist composition, and the concentration of the second compound in the second photoresist composition is less than the concentration of the second compound in the first photoresist composition. In an embodiment, the amine is ammonia or hydrazine. In an embodiment, the amine, borane, or phosphine includes a halide substituent.

Another embodiment of the disclosure is a method of manufacturing a semiconductor device, including forming a multilayer resist structure over a substrate, wherein the multilayer resist structure includes two or more resist layers. Each of the two or more resist layers include a reaction product of an organometallic compound and a compound selected from the group consisting of water, an amine, a borane, and a phosphine. Each of the two or more resist layers have different physical parameters. The multilayer resist structure is patternwise crosslinked to form a latent pattern in the multilayer resist structure. The latent pattern is developed by applying a developer to the patternwise crosslinked multilayer resist structure to form a pattern in the multilayer resist structure. In an embodiment, the patternwise crosslinking the multilayer resist structure, includes patternwise exposing the two or more resist layers to actinic radiation, and heating the two or more resist layers after the patternwise exposing. In an embodiment, the actinic radiation includes extreme ultraviolet radiation or an electron beam. In an embodiment, the heating the two or more resist layers includes heating the two or more resist layers at a temperature ranging from 50° C. to 250° C. In an embodiment, the physical parameters are crosslinking densities of the two or more resist layers. In an embodiment, the physical parameters are thicknesses of the two or more resist layers. In an embodiment, the organometallic compound has a formula: $M_aR_bX_c$, where M is one or more selected from the group consisting of Sn, Bi, Sb, In, and Te; R is a substituted or unsubstituted alkyl, alkenyl, or carboxylate group; X is a halide or sulfonate group; and $1 \leq a \leq 2$, $b \geq 1$, $c \geq 1$, and $b+c \leq 5$. In an embodiment, the alkyl, alkenyl, or carboxylate group is substituted with one or more fluoro groups. In an embodiment, the sulfonate group is substituted with one or more amine groups. In an embodiment, the two or more resist layers include 3 to 6 resist layers. In an embodiment, the amine is ammonia or hydrazine. In an embodiment, the amine, borane, or phosphine includes a halide substituent.

Another embodiment of the disclosure is a method of forming a pattern, including forming a first photoresist layer over a substrate and forming a second photoresist layer over the first photoresist layer. A third photoresist layer is formed over the second photoresist layer. A fourth photoresist layer is formed over the third photoresist layer. A fifth photoresist layer is formed over the fourth photoresist layer. The first, second, third, fourth, and fifth photoresist layers have different physical parameters and the first, second, third, fourth, and fifth photoresist layers form a multilayer photoresist structure. The multilayer photoresist structure is selectively exposed to actinic radiation to form a latent pattern. The latent pattern is developed by applying a developer to the selectively exposed multilayer photoresist structure to form the pattern. In an embodiment, the actinic radiation is extreme ultraviolet radiation. In an embodiment, the method includes after selectively exposing the multilayer photoresist structure to actinic radiation to form a latent pattern and before developing the latent pattern, post-exposure heating the multilayer photoresist structure at a temperature ranging from 50° C. to 250° C. In an embodiment, the photoresist layers comprise metal-containing photoresist compositions. In an embodiment, the different physical parameters of the photoresist layer include different crosslinking densities or different photoresist layer thicknesses. In an embodiment, the first photoresist layer has a first crosslinking density, the second photoresist layer has a second crosslinking density, the third photoresist layer has a third crosslinking density, the fourth photoresist layer has a fourth crosslinking density, the fifth photoresist layer has a fifth crosslinking density, the second crosslinking density is greater than the first, third, and fourth crosslinking densities, and the third crosslinking density is greater than the first and fourth crosslinking densities. In an embodiment, the method includes performing a heating operation after each of the first photoresist layer, second photoresist layer, third photoresist layer, fourth photoresist layer, and the fifth photoresist layer is formed.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, comprising:
    forming a multilayer photoresist structure comprising a metal-containing photoresist over a substrate,
    wherein the multilayer photoresist structure includes two or more metal-containing photoresist layers having different physical parameters,
    wherein the metal-containing photoresist is a reaction product of a first precursor and a second precursor, and
    wherein each layer of the multilayer photoresist structure is formed using different photoresist layer formation parameters,
        wherein the different photoresist layer formation parameters are one or more selected from the group consisting of the first precursor, an amount of the first precursor, the second precursor, an amount of the second precursor, a length of time of each photoresist layer formation operation, and heating conditions of the photoresist layers;
    selectively exposing the multilayer photoresist structure to actinic radiation to form a latent pattern;
    heating the selectively exposed multilayer photoresist structure at a temperature ranging from 50°° C. to 250° C.; and
    developing the latent pattern by applying a developer to the selectively exposed multilayer photoresist structure after the heating the selectively exposed multilayer photoresist structure.

2. The method according to claim 1, wherein the actinic radiation is extreme ultraviolet radiation.

3. The method according to claim 1, further comprising heating each photoresist layer at a temperature ranging from 50° C. to 200° C. after forming each layer.

4. The method according to claim 1, wherein the multilayer photoresist structure is formed by chemical vapor deposition (CVD) or atomic layer deposition (ALD).

5. The method according to claim 1, wherein:
    the multilayer photoresist structure includes a first photoresist layer overlying the substrate, and a second photoresist layer overlying the first photoresist layer,
    the photoresist layers are the reaction products of the first precursor and the second precursor,
    the first photoresist layer is formed by combining the first precursor and the second precursor having a first concentration, the second photoresist layer is formed by combining the first precursor and the second precursor having a second concentration, and
    the first and second concentrations of the second precursor are different from each other.

6. The method according to claim 5, further comprising forming a third photoresist layer over the second photoresist layer,
 wherein the third photoresist layer is formed by combining the first precursor and the second precursor having a third concentration, and
 the third concentration is different from the first and second concentrations.

7. The method according to claim 1, further comprising performing a heating operation after each photoresist layer of the two or more photoresist layers is formed.

8. A method of manufacturing a semiconductor device, comprising:
 forming two or more metal-containing photoresist layers having different physical parameters,
 wherein the two or more metal-containing photoresist layers are reaction products of a first precursor and a second precursor, and
 wherein each layer of the two or more metal-containing photoresist layers is formed using different photoresist layer formation parameters,
  wherein the different photoresist layer formation parameters are one or more selected from the group consisting of the first precursor, an amount of the first precursor, the second precursor, an amount of the second precursor, a length of time of each photoresist layer formation operation, and heating conditions of the photoresist layers,
  wherein an amount of $H_2O$ present during the forming the two or more metal-containing photoresist layers over the substrate is varied to provide the two or more metal-containing photoresist layers having different physical parameters;
 selectively exposing the two or more metal-containing photoresist layers to actinic radiation to form a latent pattern; and
 developing the latent pattern by applying a developer to the selectively exposed two or more metal-containing photoresist layers.

9. The method according to claim 8, wherein the actinic radiation is extreme ultraviolet radiation.

10. The method according to claim 8, further comprising heating each photoresist layer at a temperature ranging from 50° C. to 200° C. after forming each layer.

11. The method according to claim 8, wherein the photoresist layers are formed by chemical vapor deposition (CVD) or atomic layer deposition (ALD).

12. The method according to claim 8, wherein:
 the photoresist layers are the reaction products of the first precursor and the second precursor,
 a first photoresist layer is formed by combining the first precursor and the second precursor having a first concentration,
 a second photoresist layer is formed by combining the first precursor and the second precursor having a second concentration, and
 the first and second concentrations of the second precursor are different from each other.

13. The method according to claim 12, further comprising forming a third photoresist layer over the second photoresist layer,
 wherein the third photoresist layer is formed by combining the first precursor and the second precursor having a third concentration, and
 the third concentration is different from the first and second concentrations.

14. The method according to claim 8, further comprising performing a heating operation after each photoresist layer of the two or more photoresist layers is formed.

15. The method according to claim 8, wherein the two or more metal-containing photoresist layers have different thicknesses.

16. A method of manufacturing a semiconductor device, comprising:
 forming a first photoresist layer having a first physical parameter over a substrate by depositing a first photoresist composition in a first vapor phase deposition operation at a first deposition parameter;
 forming a second photoresist layer having a second physical parameter over the first photoresist layer by depositing a second photoresist composition in a second vapor phase deposition operation at a second deposition parameter,
 wherein the first physical parameter is different from the second physical parameter,
 wherein the first deposition parameter is different from the second deposition parameter, and
 wherein the first deposition parameter and the second deposition parameter are an amount of $H_2O$ present during the forming the first and second photoresist layers;
 selectively exposing the first and second photoresist layers to actinic radiation to form a latent pattern; and
 developing the latent pattern by applying a developer to the selectively exposed first and second photoresist layers.

17. The method according to claim 16, wherein the first and second vapor phase deposition operations are atomic layer deposition (ALD) or chemical vapor deposition (CVD).

18. The method according to claim 17, further comprising forming a third photoresist layer over the second photoresist layer by a third vapor phase deposition operation at a third deposition parameter,
 wherein the third deposition parameter is an amount of $H_2O$ present during the forming the third photoresist layer and the amount of $H_2O$ present during the forming the third photoresist layer is different from the first and second deposition parameters.

19. The method according to claim 18, wherein an amount of the third deposition parameter is between an amount of the first deposition parameter and an amount of the second deposition parameter.

20. The method according to claim 16, further comprising after selectively exposing the first and second photoresist layers to actinic radiation to form a latent pattern and before developing the latent pattern, post-exposure heating the first and second photoresist layers at a temperature ranging from 50° C. to 250° C.

* * * * *